US012205645B2

(12) United States Patent
Kamisaka et al.

(10) Patent No.: US 12,205,645 B2
(45) Date of Patent: Jan. 21, 2025

(54) THREE-DIMENSIONAL MEMORY STRUCTURE FABRICATION USING CHANNEL REPLACEMENT

(71) Applicant: SUNRISE MEMORY CORPORATION, San Jose, CA (US)

(72) Inventors: Shohei Kamisaka, Kanagawa (JP); Vinod Purayath, Sedona, AZ (US)

(73) Assignee: SUNRISE MEMORY CORPORATION, San Jose, CA (US)

( * ) Notice: Subject to any disclaimer, the term of this patent is extended or adjusted under 35 U.S.C. 154(b) by 467 days.

(21) Appl. No.: 17/723,204

(22) Filed: Apr. 18, 2022

(65) Prior Publication Data

US 2022/0343980 A1    Oct. 27, 2022

Related U.S. Application Data

(60) Provisional application No. 63/179,019, filed on Apr. 23, 2021.

(51) Int. Cl.
| | | |
|---|---|---|
| *H01L 21/00* | (2006.01) | |
| *G11C 16/04* | (2006.01) | |
| *H01L 23/522* | (2006.01) | |
| *H01L 23/528* | (2006.01) | |
| *H10B 41/10* | (2023.01) | |
| *H10B 41/27* | (2023.01) | |
| *H10B 43/10* | (2023.01) | |
| *H10B 43/27* | (2023.01) | |

(52) U.S. Cl.
CPC ...... *G11C 16/0483* (2013.01); *H01L 23/5226* (2013.01); *H01L 23/5283* (2013.01); *H10B 41/10* (2023.02); *H10B 41/27* (2023.02); *H10B 43/10* (2023.02); *H10B 43/27* (2023.02)

(58) Field of Classification Search
CPC ............ G11C 16/0483; H01L 23/5226; H01L 23/5283
See application file for complete search history.

(56) References Cited

U.S. PATENT DOCUMENTS

| | | | | |
|---|---|---|---|---|
| 10,121,553 | B2 * | 11/2018 | Harari ................. | H01L 29/7926 |
| 11,839,086 | B2 * | 12/2023 | Petti ..................... | G11C 11/2259 |
| 11,917,821 | B2 * | 2/2024 | Purayath ................ | H10B 43/20 |
| 11,955,179 | B2 * | 4/2024 | Inuzuka ................. | H10B 41/41 |
| 2016/0329341 | A1 * | 11/2016 | Shimabukuro ........ | H10B 41/35 |
| 2017/0098658 | A1 * | 4/2017 | Matsuda ................ | H10B 41/10 |
| 2018/0308856 | A1 * | 10/2018 | Cho ....................... | H10B 43/27 |
| 2020/0020702 | A1 * | 1/2020 | Baek ...................... | H10B 43/50 |

(Continued)

FOREIGN PATENT DOCUMENTS

| | | | | |
|---|---|---|---|---|
| CN | 114975264 | A * | 8/2022 | ..... H01L 21/823418 |
| TW | 202339211 | A * | 10/2023 | .......... H01L 27/1159 |
| WO | WO-2023154155 | A1 * | 8/2023 | .......... H01L 27/1159 |

*Primary Examiner* — Laura M Menz

(57) ABSTRACT

A process for fabricating a three-dimensional NOR memory string of storage transistors implements a channel-last fabrication process with channel replacement using silicon germanium (SiGe). In particular, the process uses silicon germanium as a sacrificial layer, to be replaced with the channel material after the charge-storage layer of the storage transistors is formed. In this manner, the channel region is prevented from experiencing excessive high-temperature processing steps, such as during the annealing of the charge-storage layer.

23 Claims, 25 Drawing Sheets

(56) References Cited

U.S. PATENT DOCUMENTS

| | | | |
|---|---|---|---|
| 2020/0227433 A1* | 7/2020 | Purayath | H01L 21/67069 |
| 2020/0303024 A1* | 9/2020 | Harari | G11C 16/0416 |
| 2020/0343260 A1* | 10/2020 | Wang | H01L 29/7827 |
| 2021/0013224 A1* | 1/2021 | Purayath | H01L 29/40117 |
| 2021/0091113 A1* | 3/2021 | Kim | H10B 43/50 |
| 2022/0028876 A1 | 1/2022 | Purayath et al. | |
| 2022/0028886 A1* | 1/2022 | Purayath | H01L 29/40117 |
| 2022/0293180 A1* | 9/2022 | Lee | G11C 16/0483 |
| 2022/0343980 A1* | 10/2022 | Kamisaka | H10B 43/27 |
| 2022/0344364 A1* | 10/2022 | Purayath | H10B 43/20 |
| 2022/0383953 A1* | 12/2022 | Kamisaka | H01L 29/78696 |
| 2023/0027837 A1* | 1/2023 | Petti | G11C 11/2259 |
| 2023/0073372 A1* | 3/2023 | Wells | H10B 43/10 |
| 2023/0157019 A1* | 5/2023 | Purayath | H01L 29/40117 438/279 |
| 2023/0223081 A1* | 7/2023 | Inuzuka | H10B 43/27 365/185.01 |
| 2023/0262987 A1* | 8/2023 | Harari | H10B 51/30 257/295 |
| 2023/0262988 A1* | 8/2023 | Harari | H10B 51/10 257/295 |
| 2023/0282282 A1* | 9/2023 | Harari | H01L 29/792 257/314 |
| 2023/0282283 A1* | 9/2023 | Harari | H01L 29/6684 257/295 |
| 2023/0284443 A1* | 9/2023 | Okina | H01L 23/5283 257/314 |
| 2023/0343394 A1* | 10/2023 | Scarbrough | H10B 43/50 |
| 2023/0371266 A1* | 11/2023 | Kajimoto | H01L 29/66742 |
| 2023/0389314 A1* | 11/2023 | Barton | H10B 41/35 |
| 2024/0032299 A1* | 1/2024 | Tsutsumi | H10B 43/40 |
| 2024/0040798 A1* | 2/2024 | Petti | H10B 51/20 |
| 2024/0114689 A1* | 4/2024 | Zhou | H01L 29/516 |
| 2024/0127864 A1* | 4/2024 | Higashitani | H10B 43/35 |
| 2024/0130131 A1* | 4/2024 | Jeong | H10B 41/27 |
| 2024/0138151 A1* | 4/2024 | Zhou | H10B 43/10 |
| 2024/0196611 A1* | 6/2024 | Yamamoto | H01L 23/5283 |
| 2024/0260275 A1* | 8/2024 | Kamisaka | H10B 51/20 |
| 2024/0274534 A1* | 8/2024 | Or-Bach | H01L 25/50 |
| 2024/0282706 A1* | 8/2024 | Hong | H10B 43/10 |
| 2024/0290714 A1* | 8/2024 | Kraman | H10B 43/10 |

* cited by examiner

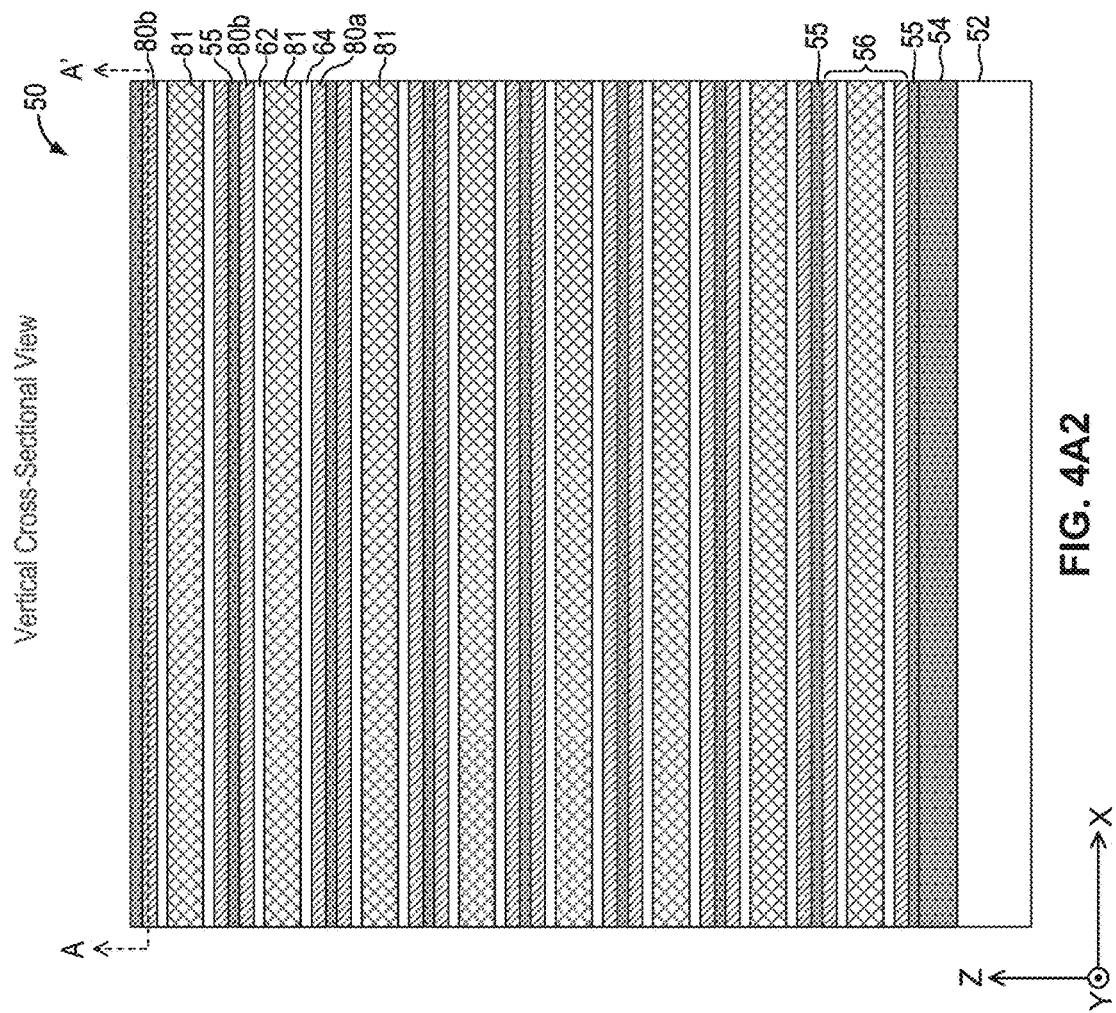
FIG. 4A2
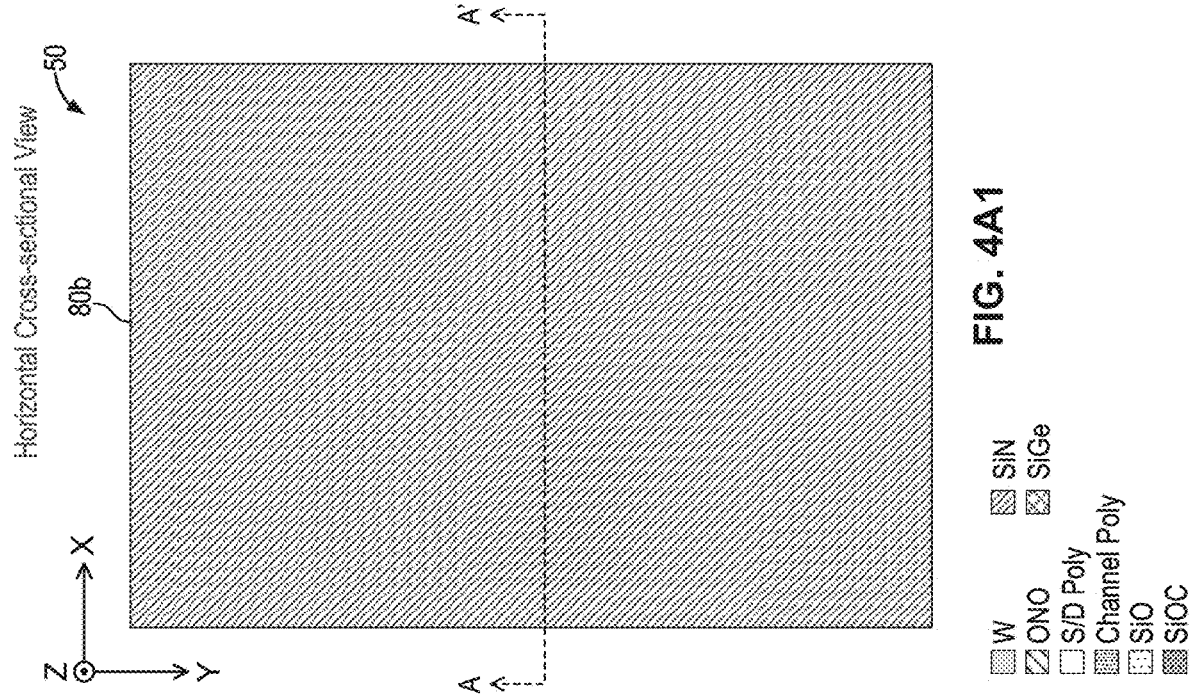
FIG. 4A1

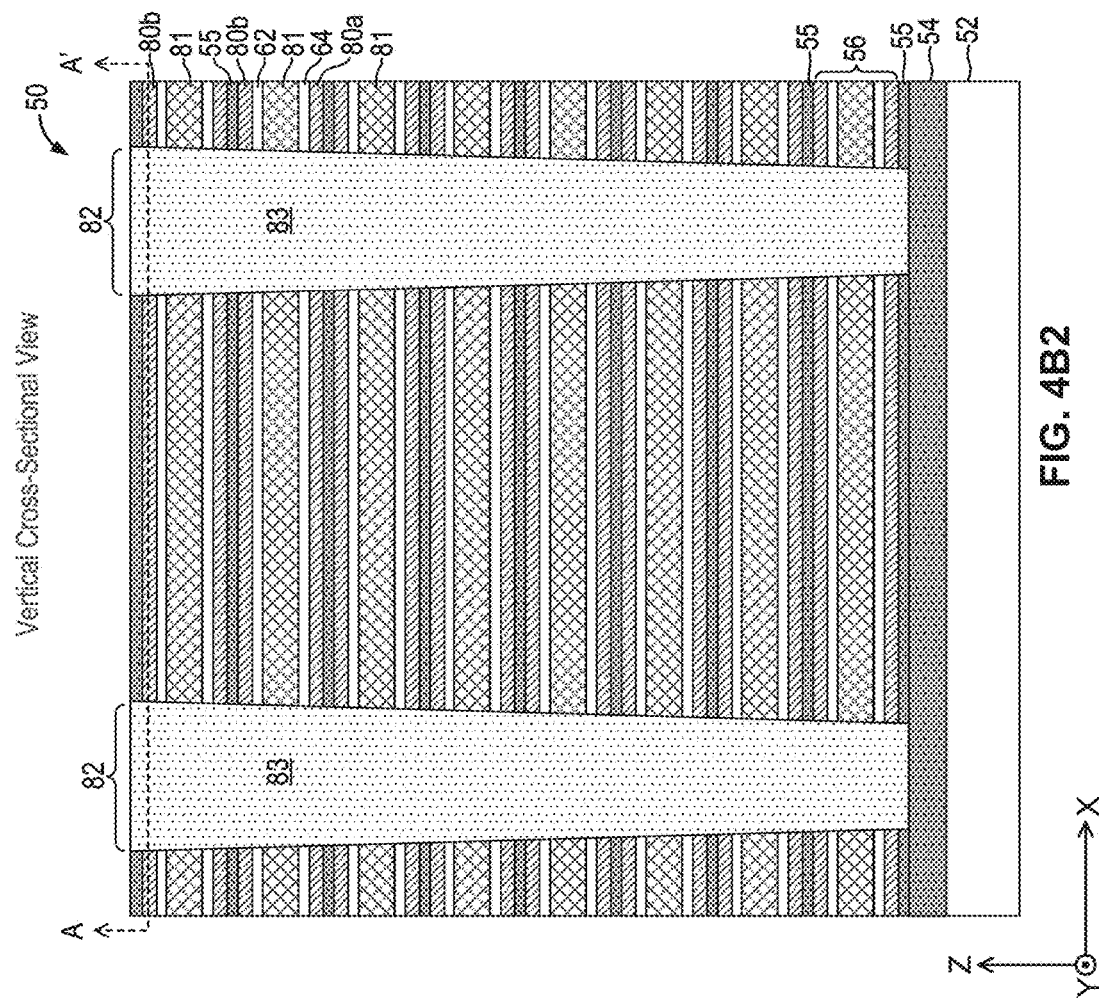
FIG. 4B2
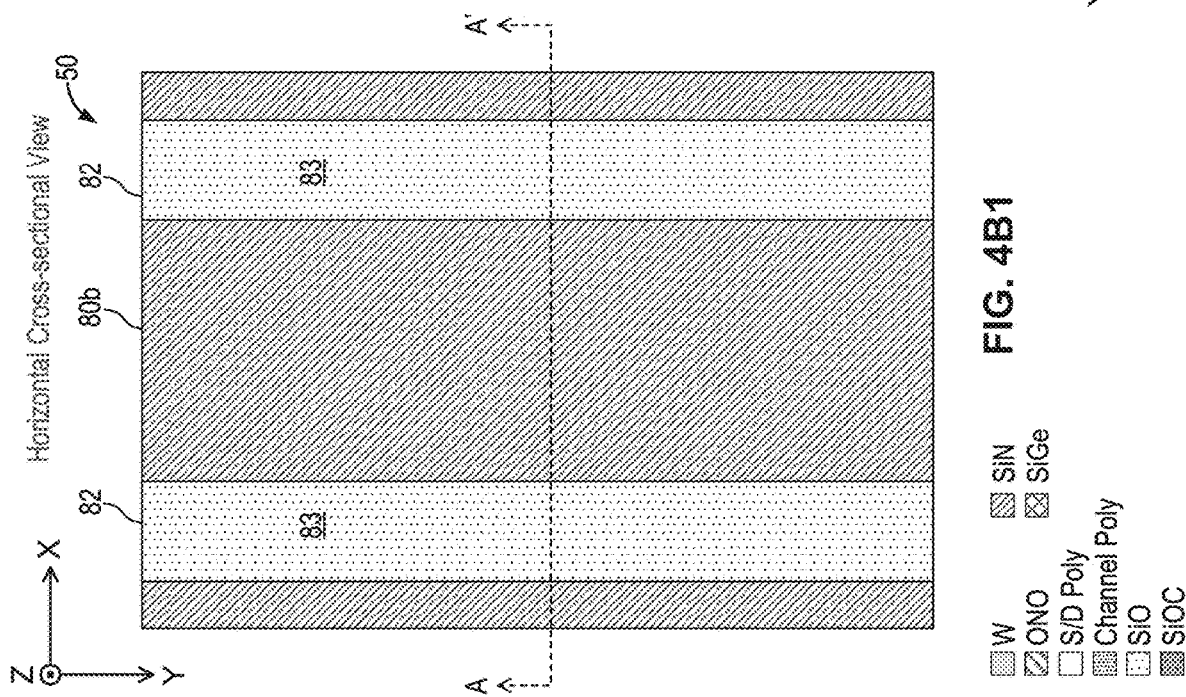
FIG. 4B1

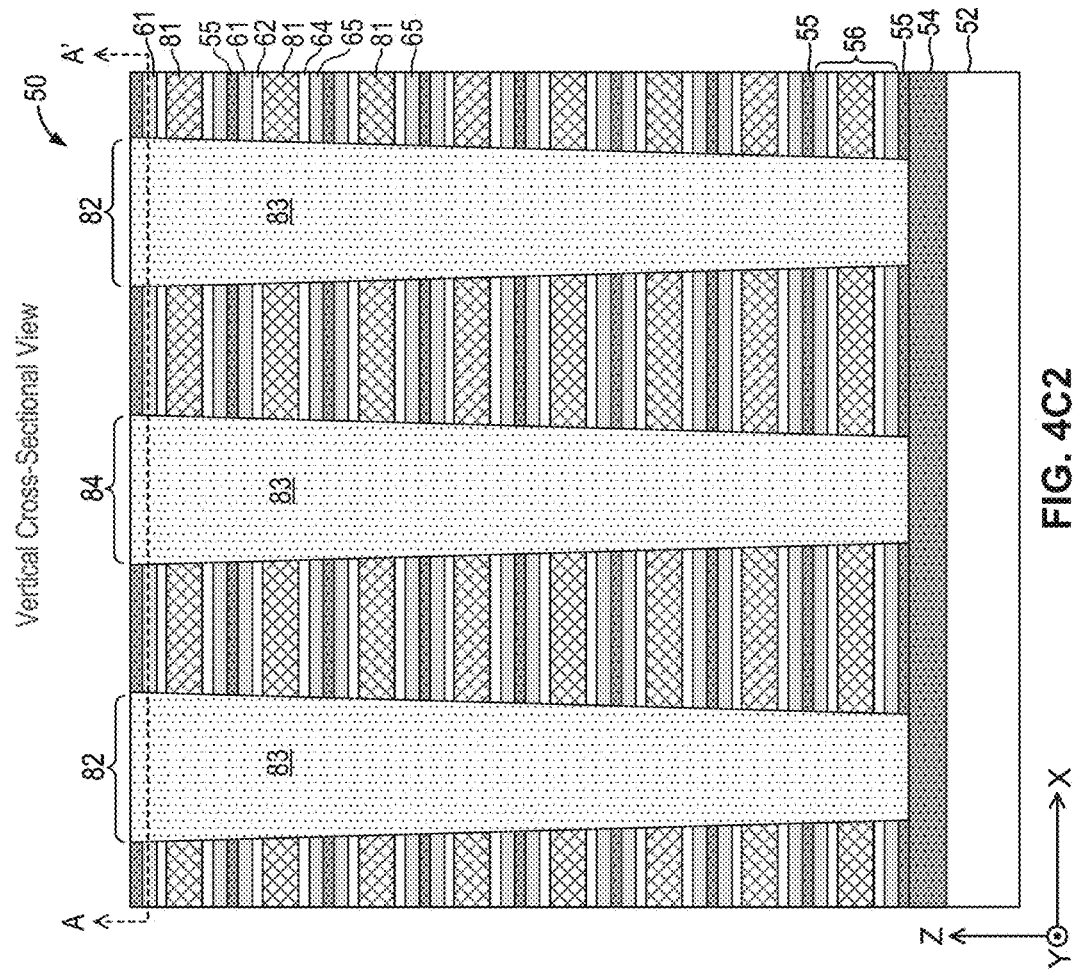
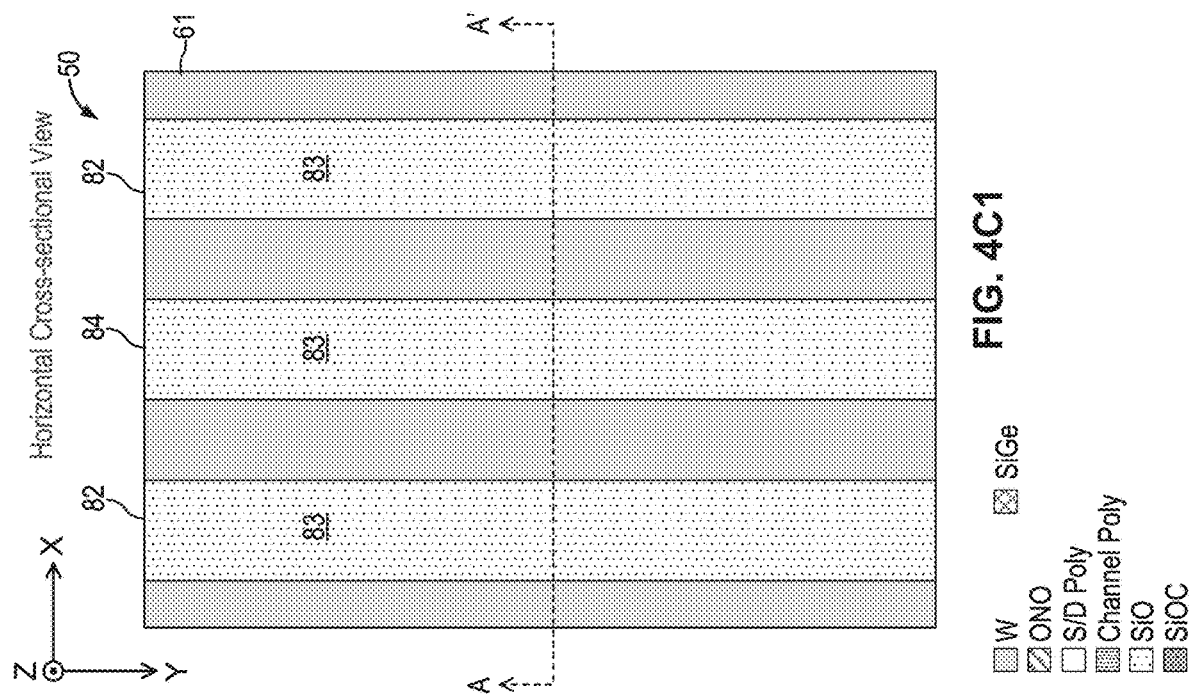
FIG. 4C2
FIG. 4C1

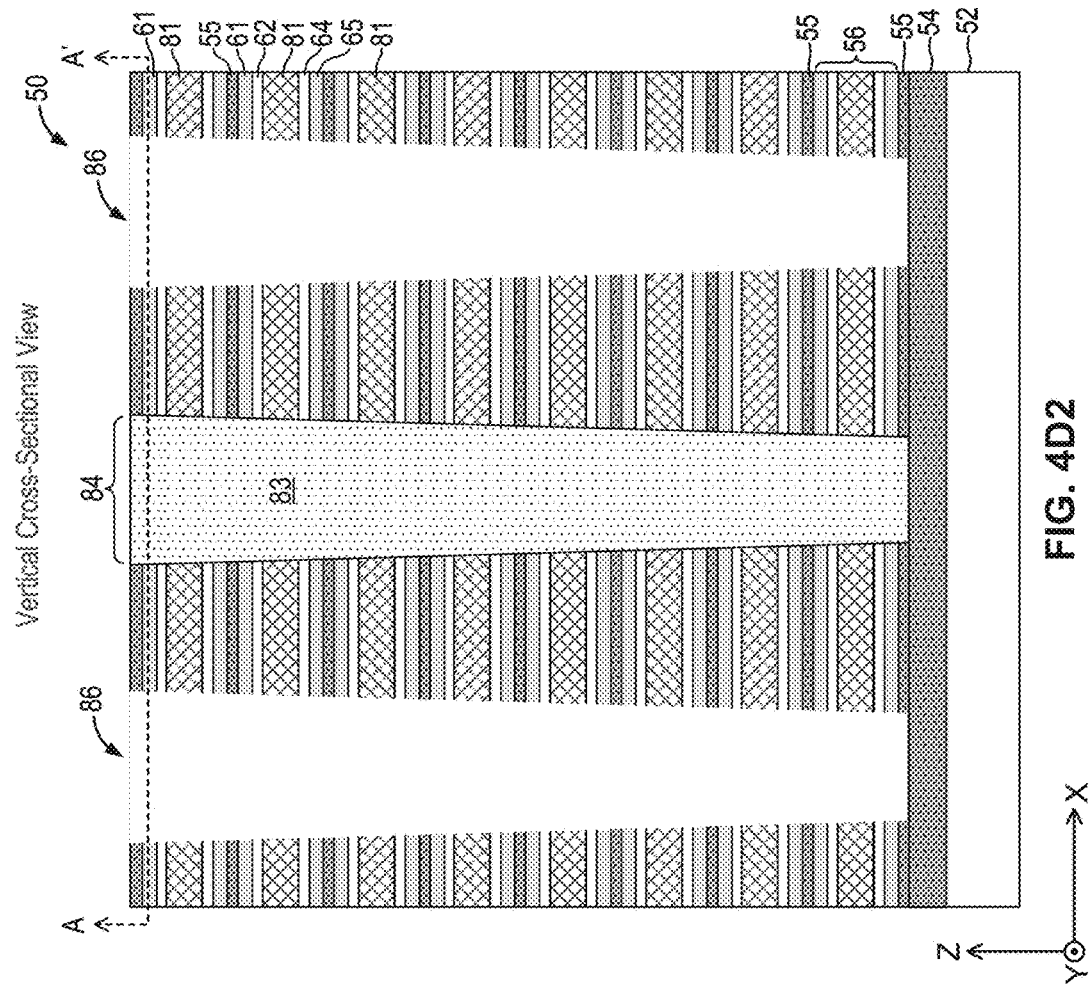
FIG. 4D2
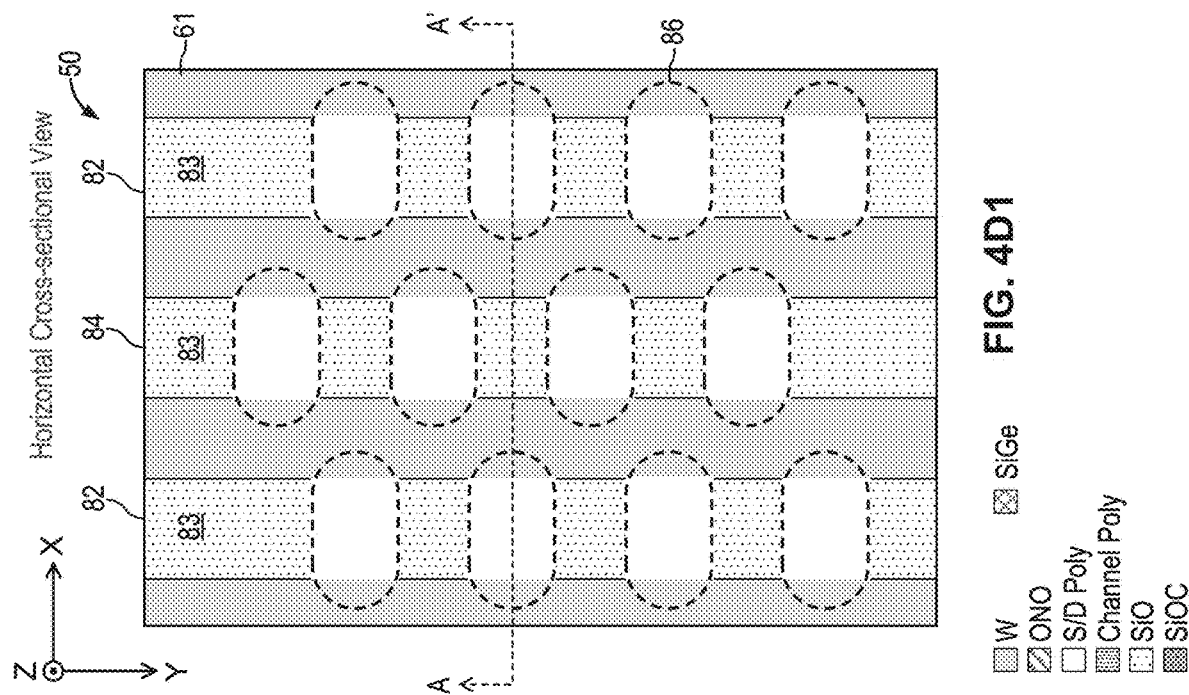
FIG. 4D1

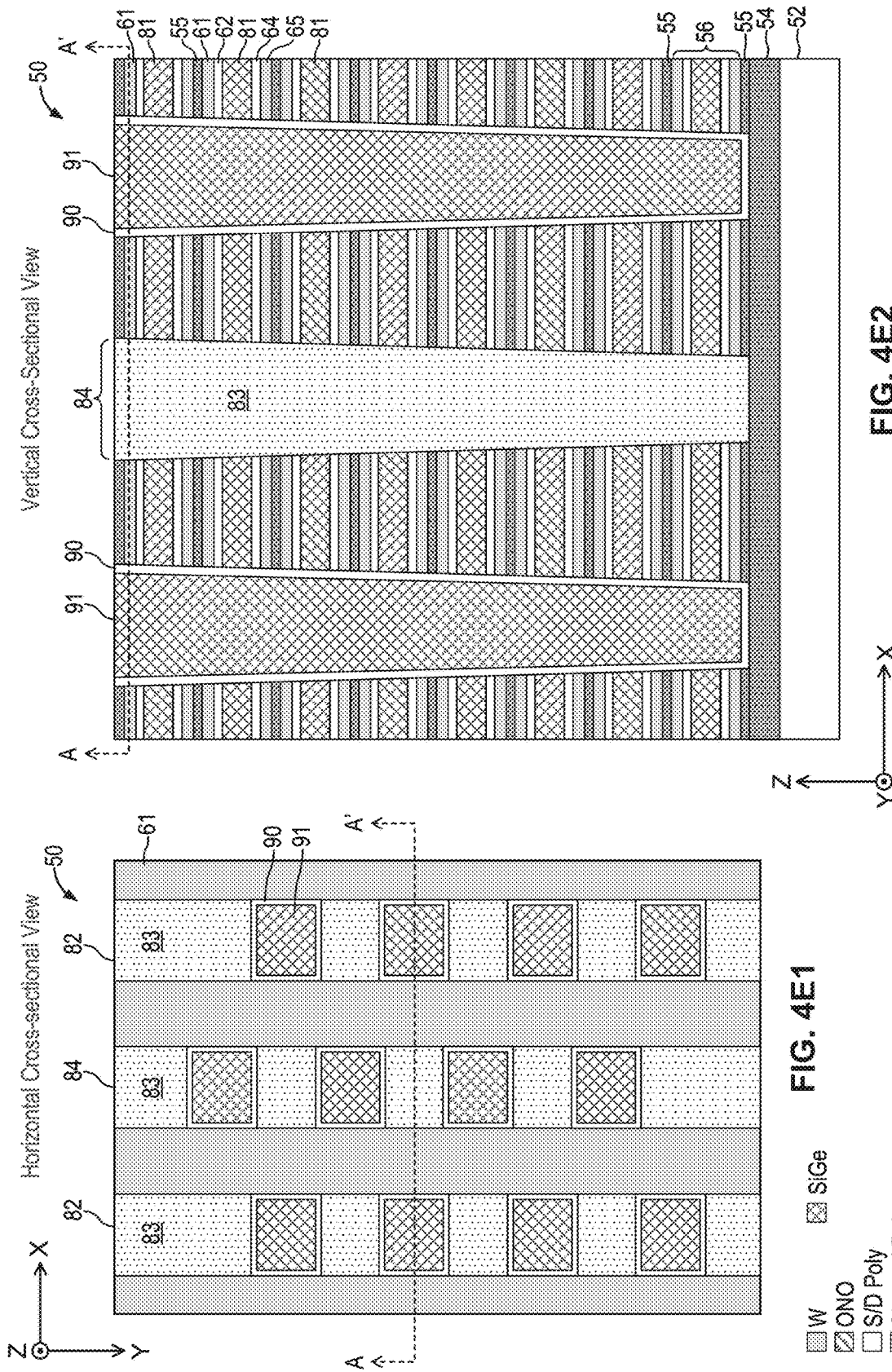

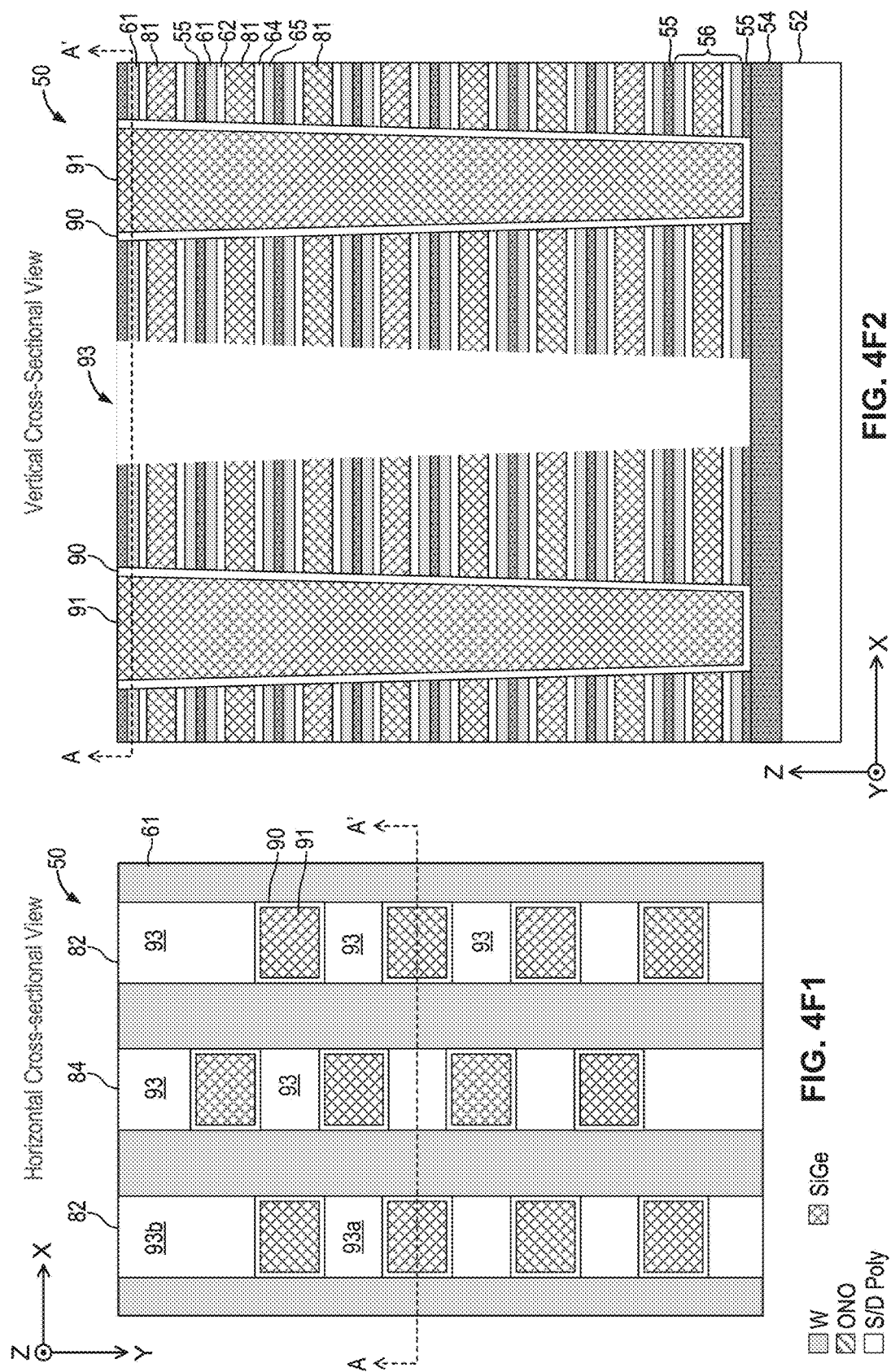
FIG. 4F1
FIG. 4F2

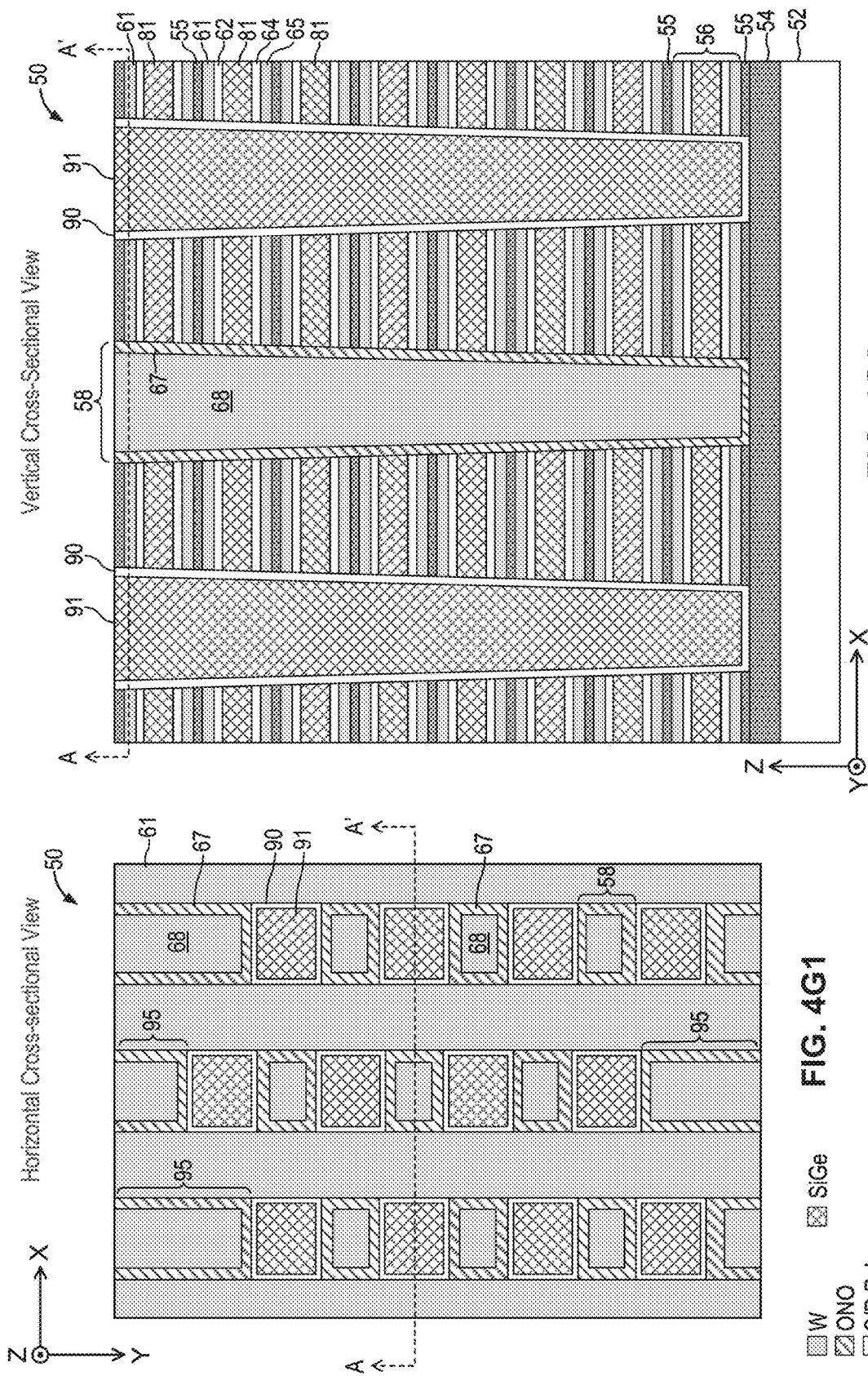
FIG. 4G1
FIG. 4G2

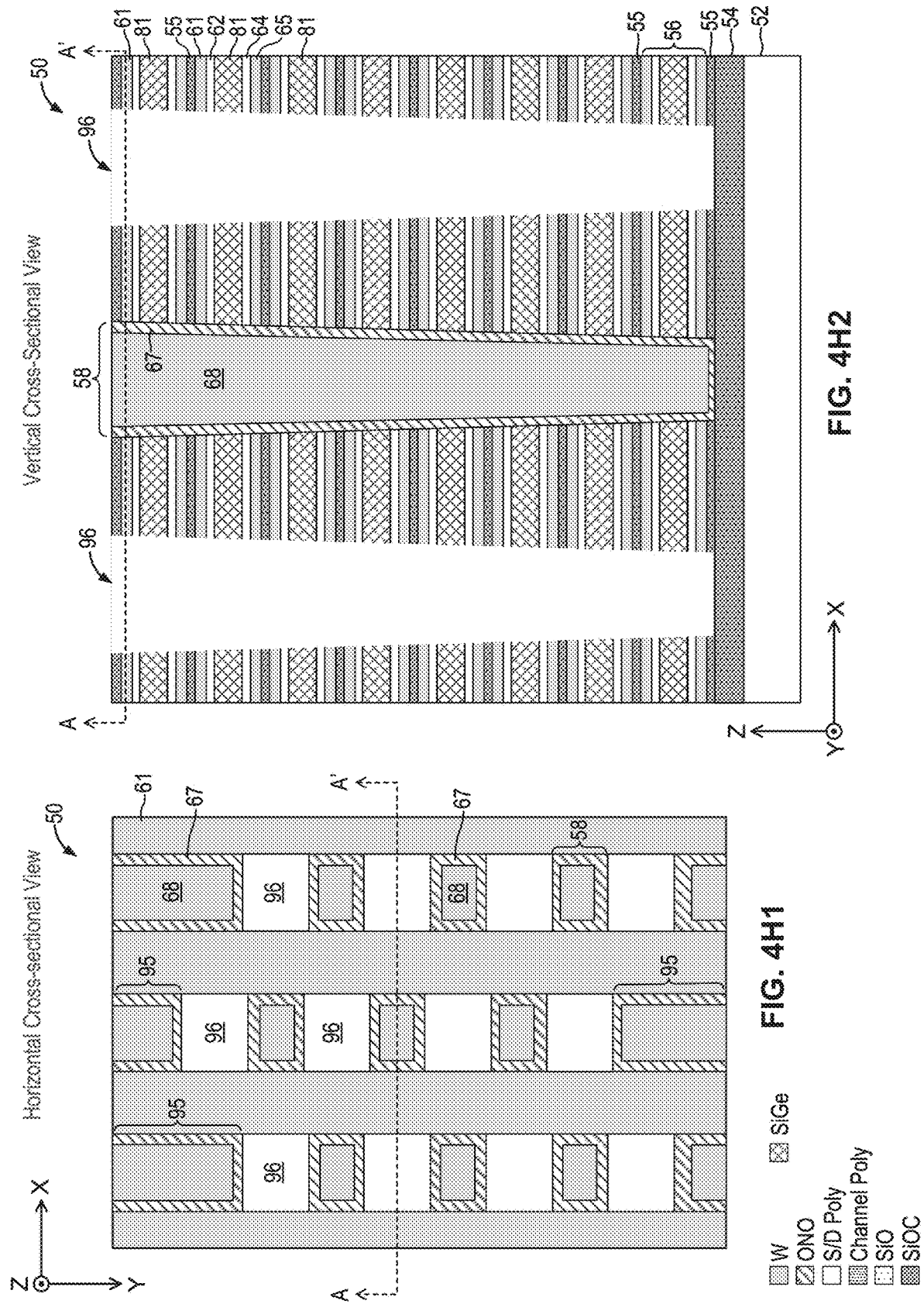

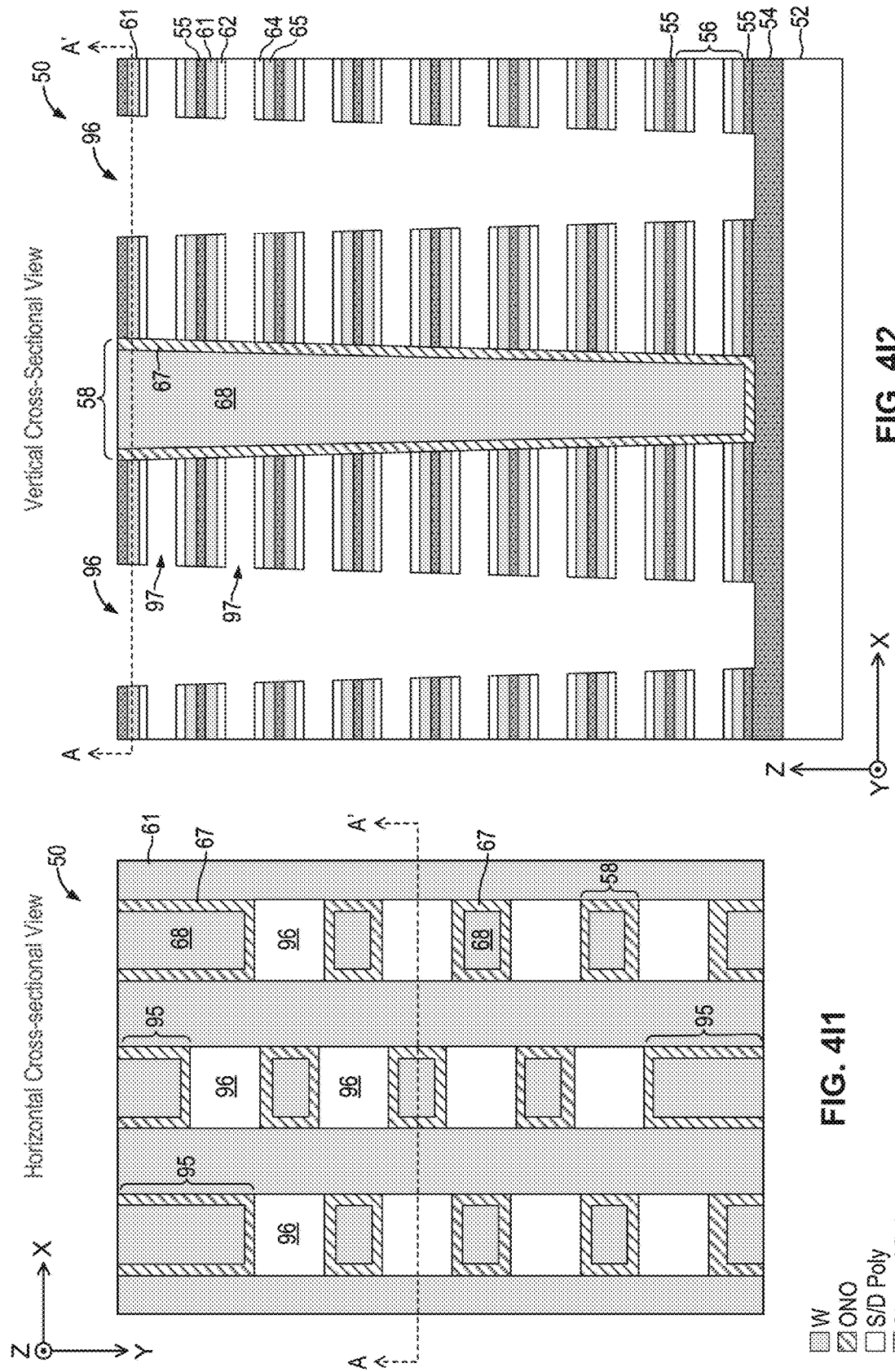
FIG. 4I2
FIG. 4I1

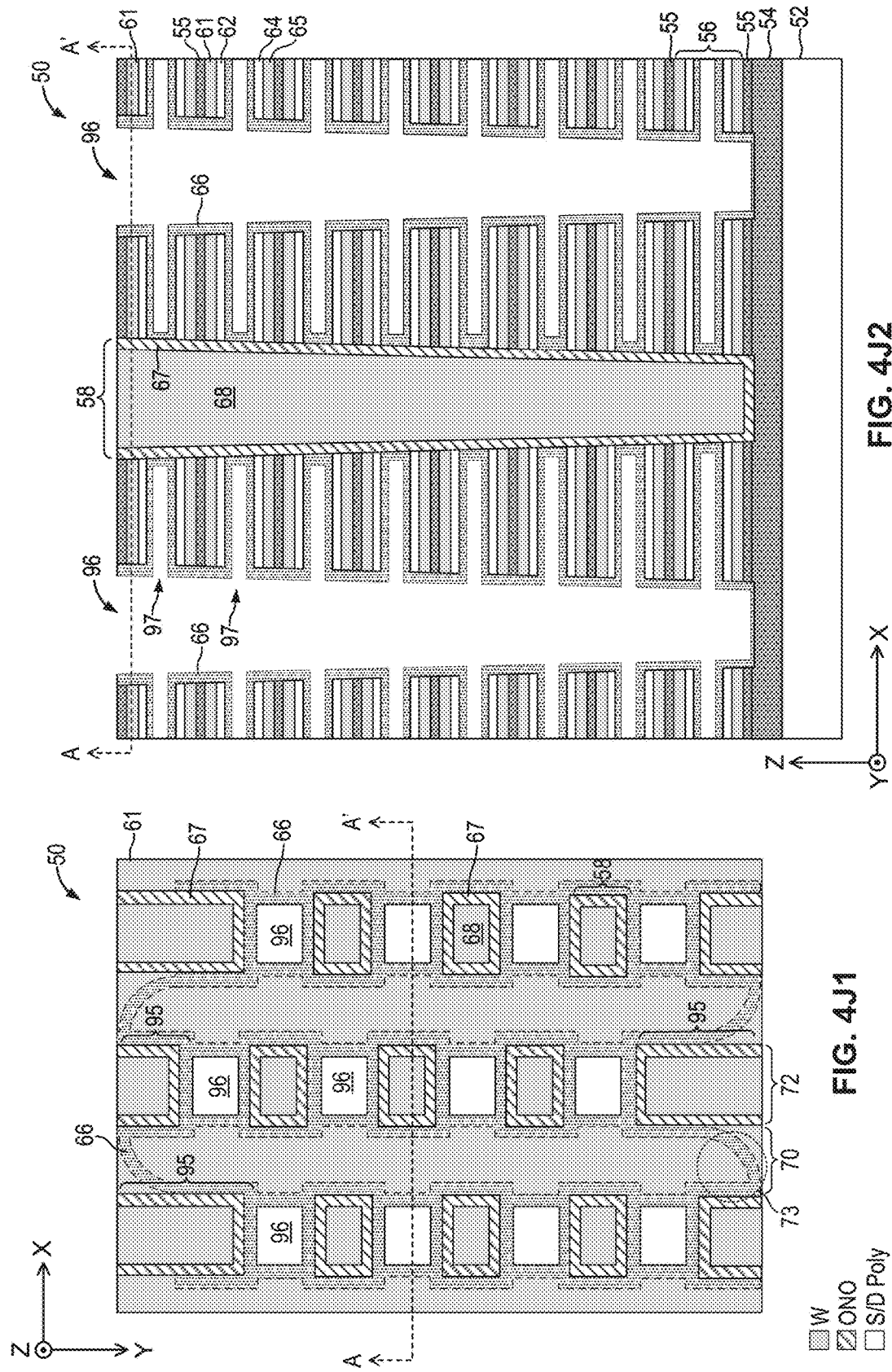
FIG. 4J2
FIG. 4J1

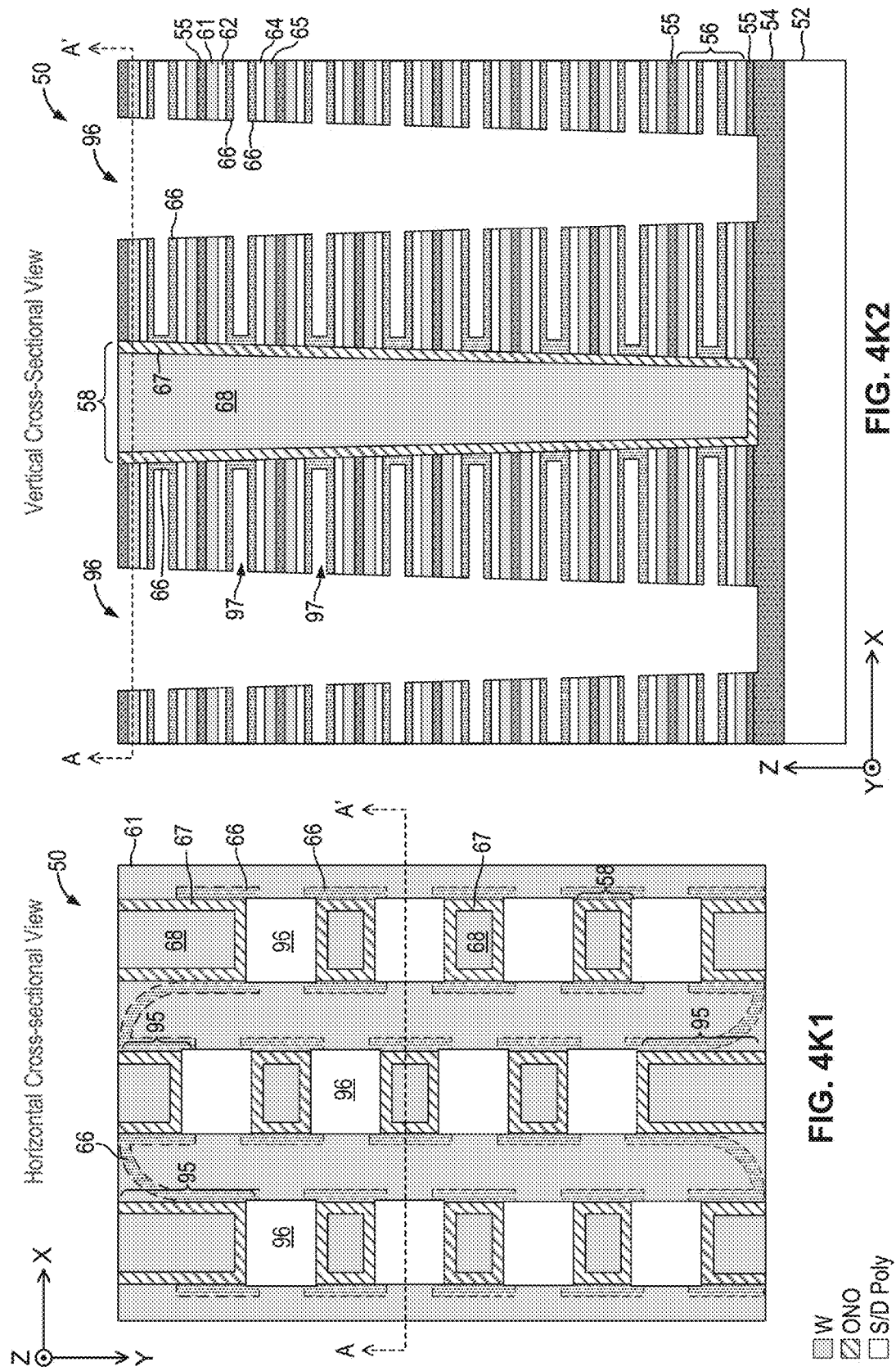

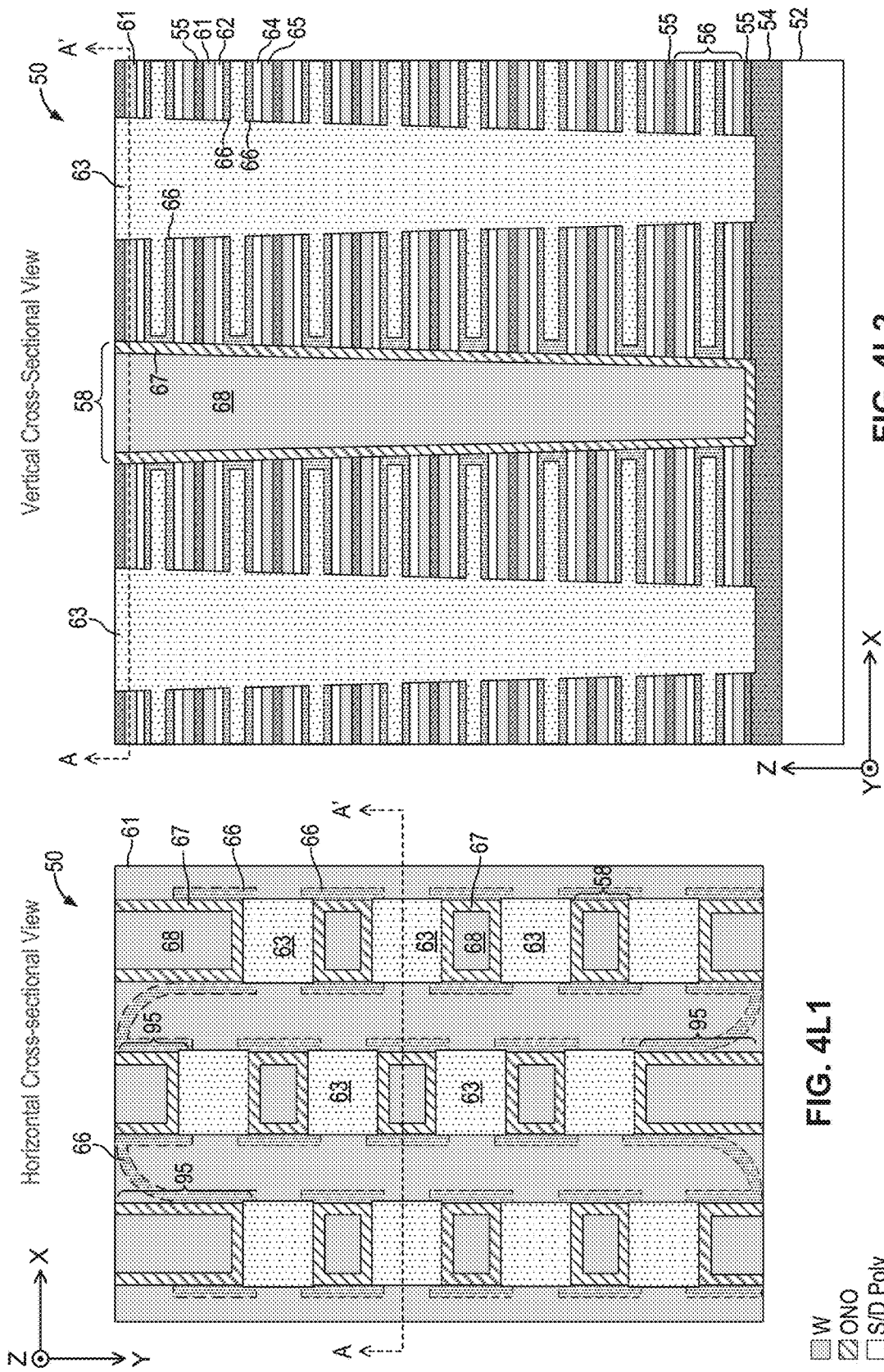

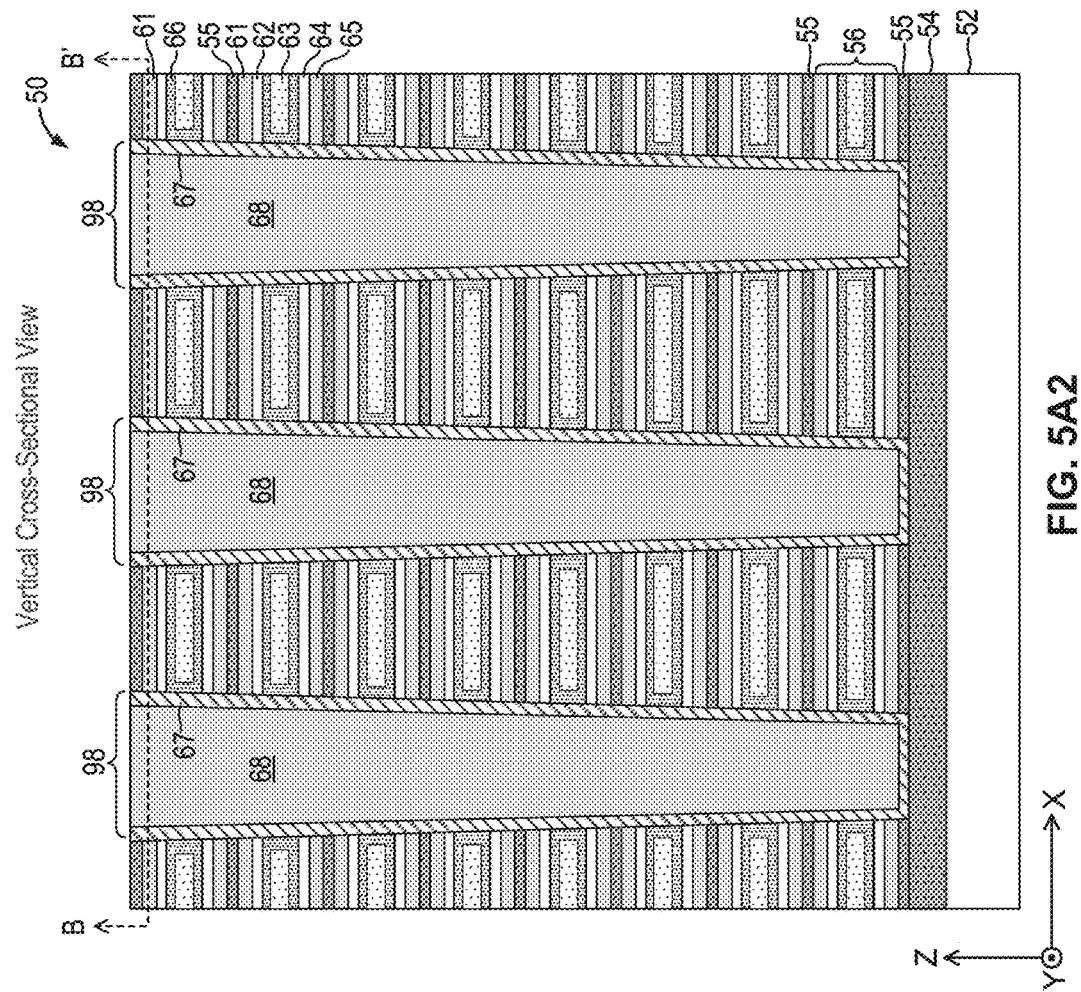
FIG. 5A2
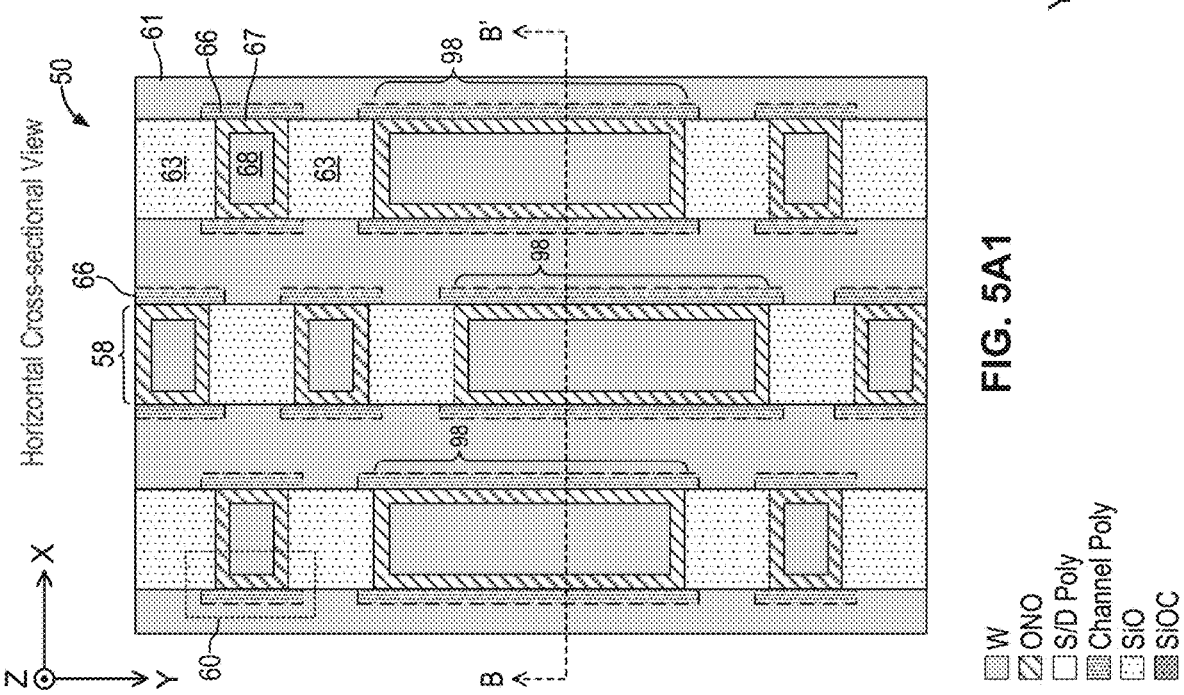
FIG. 5A1

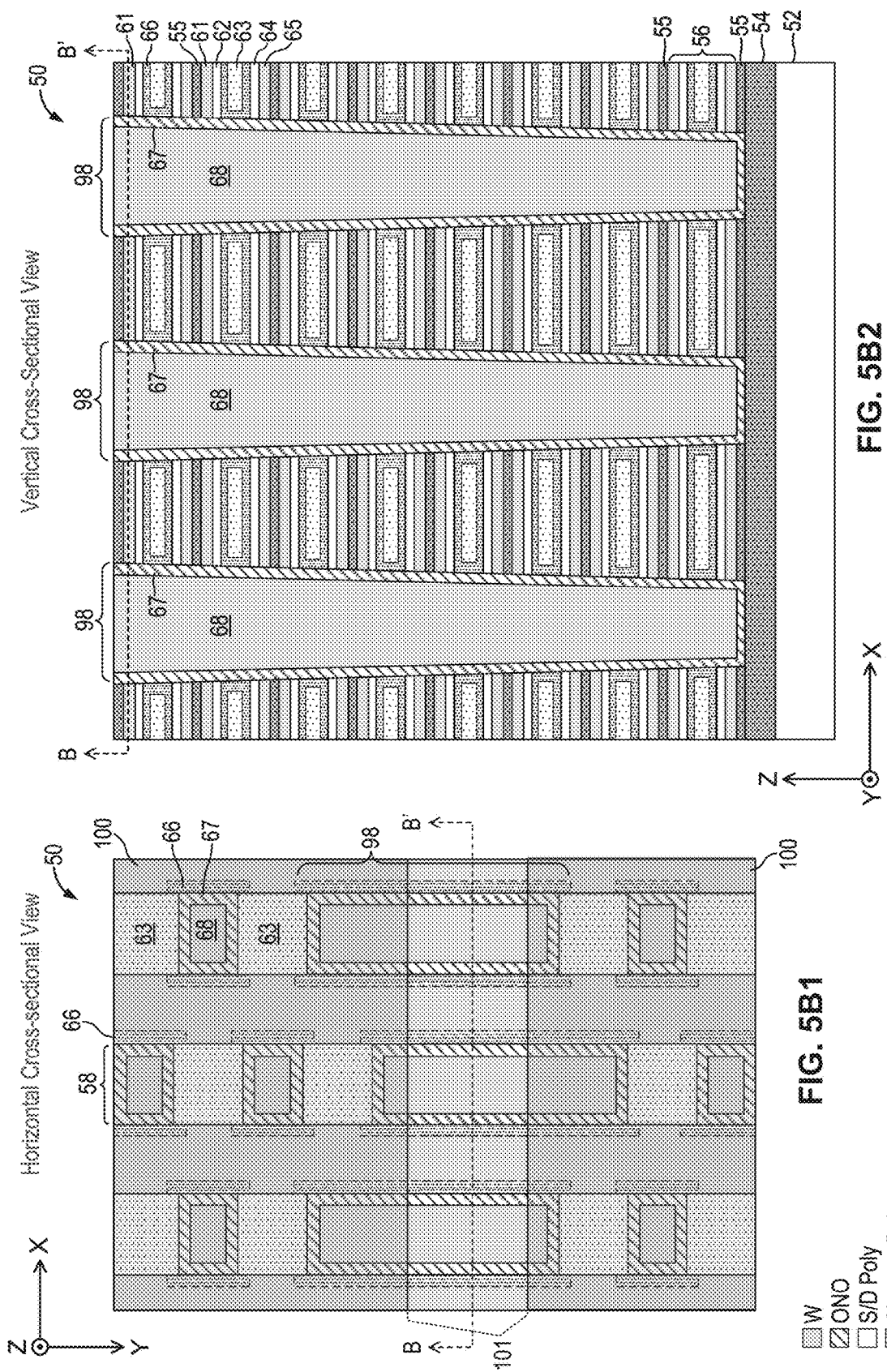
FIG. 5B1
FIG. 5B2

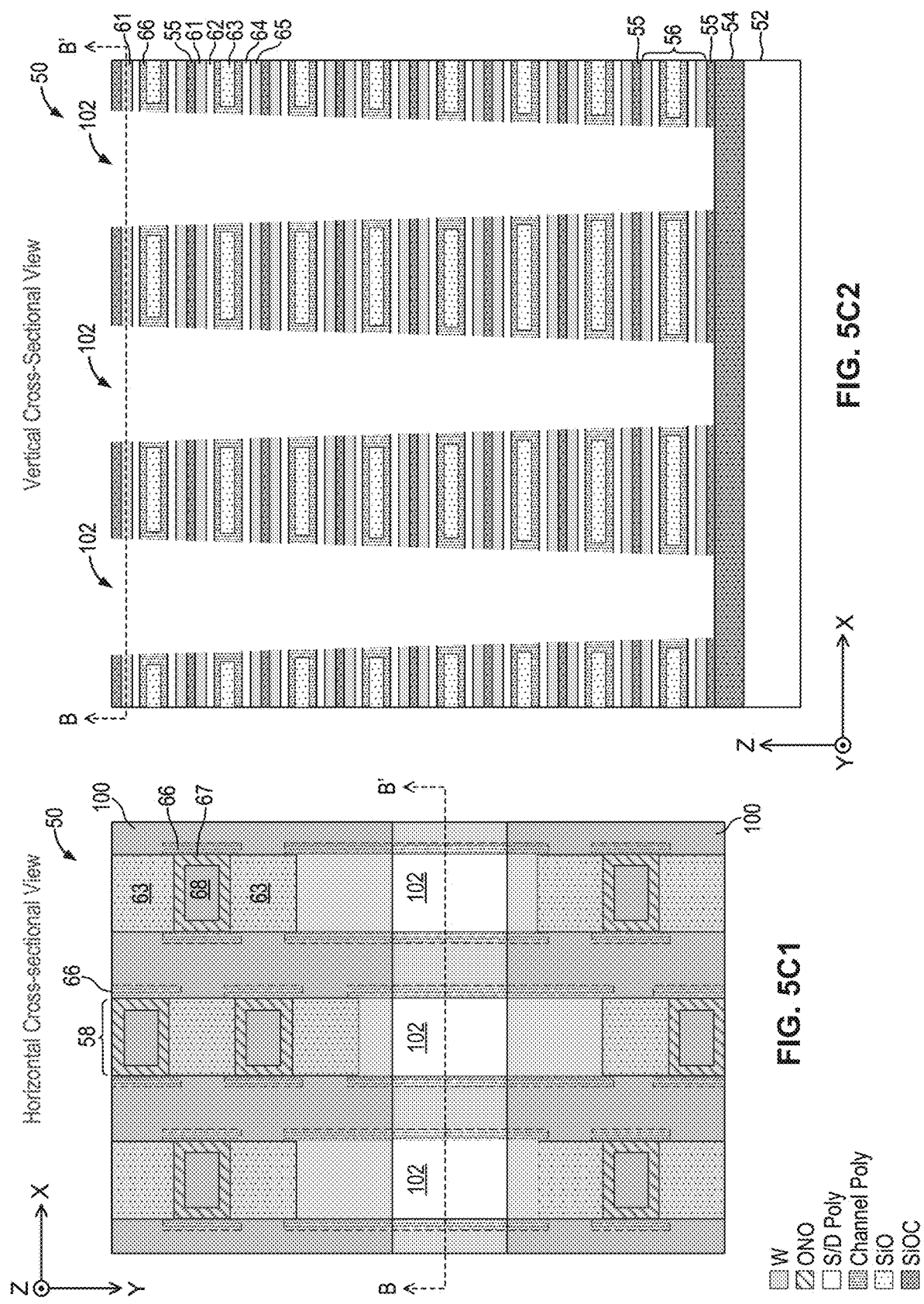

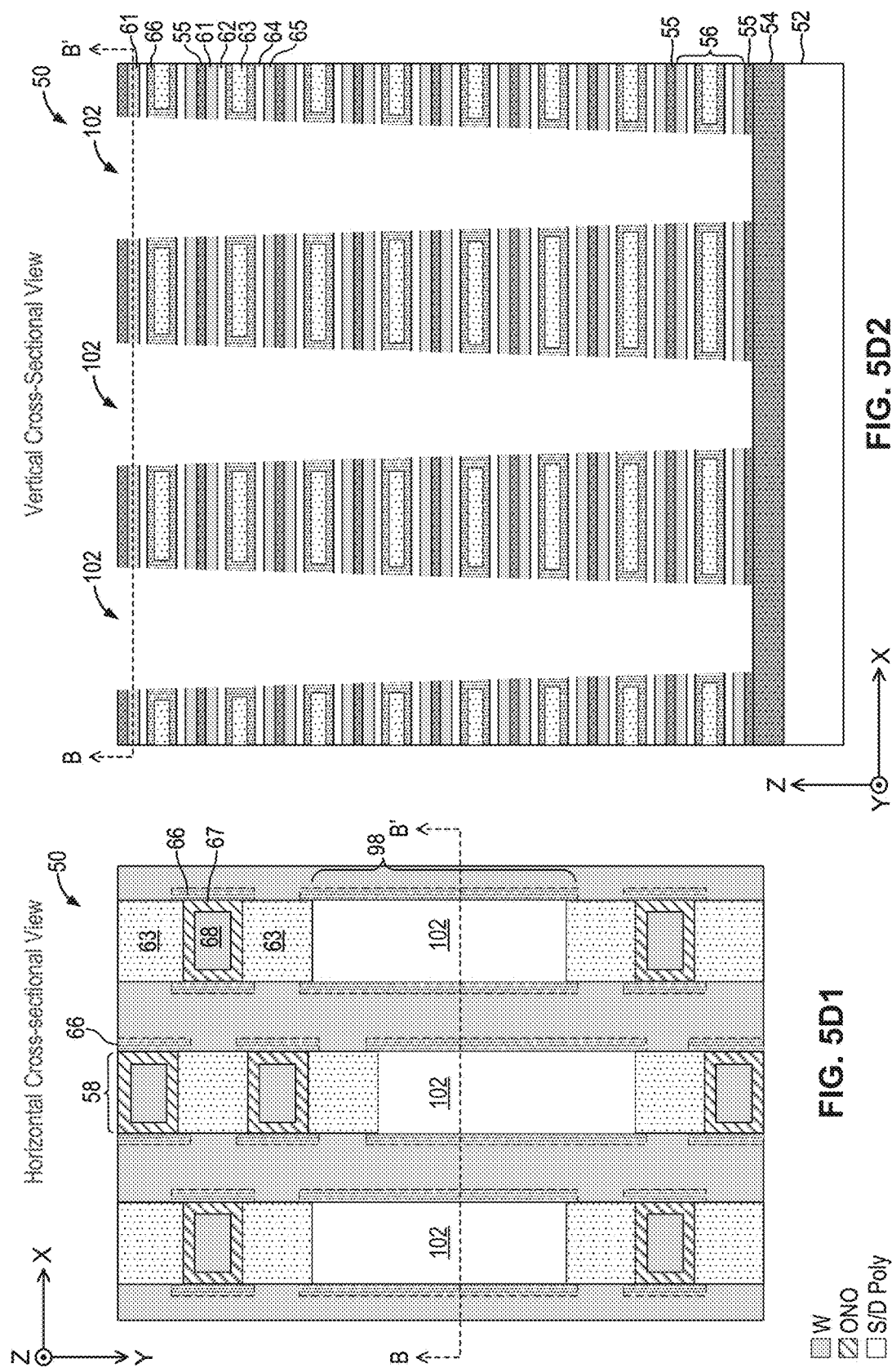

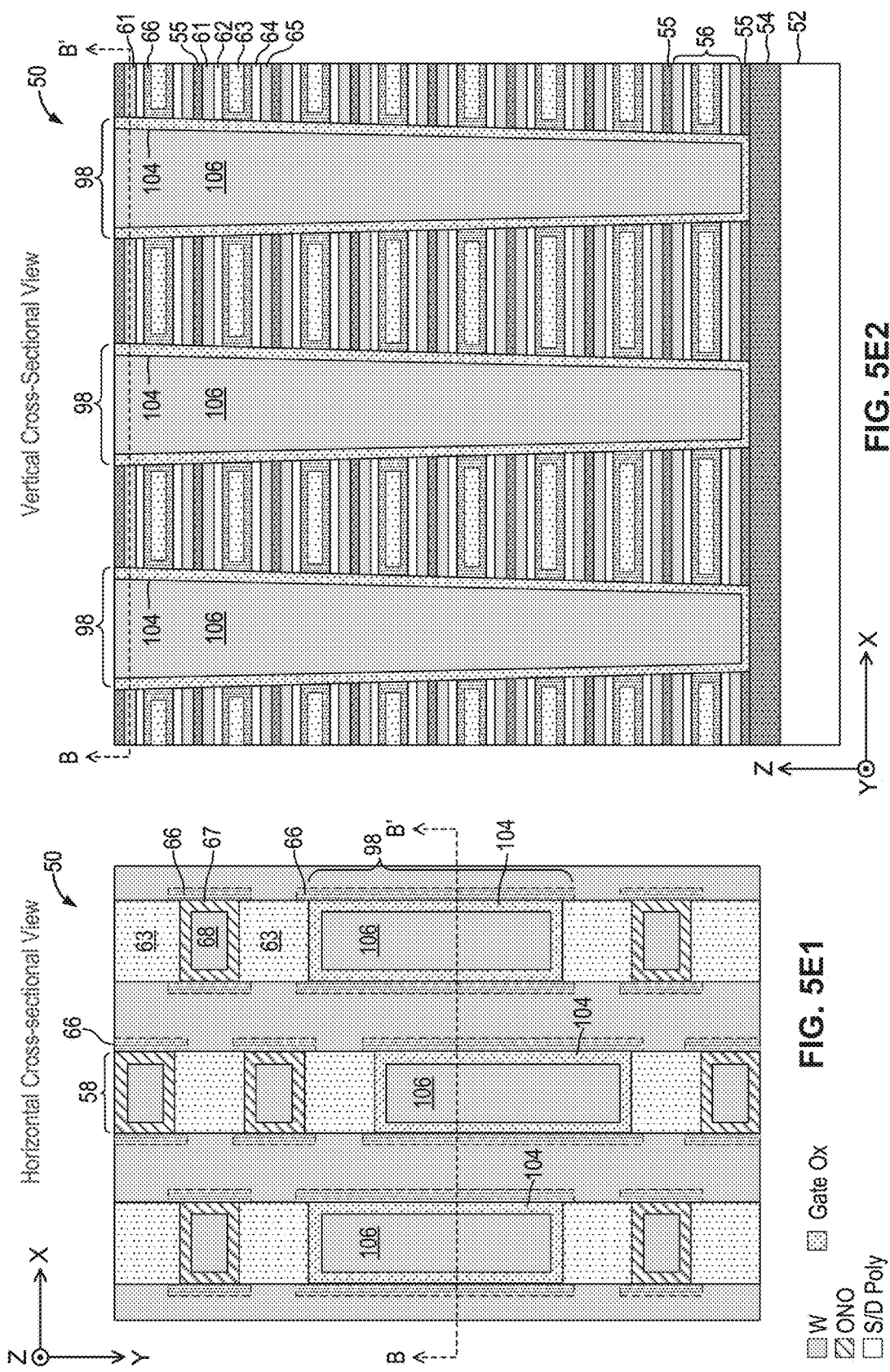

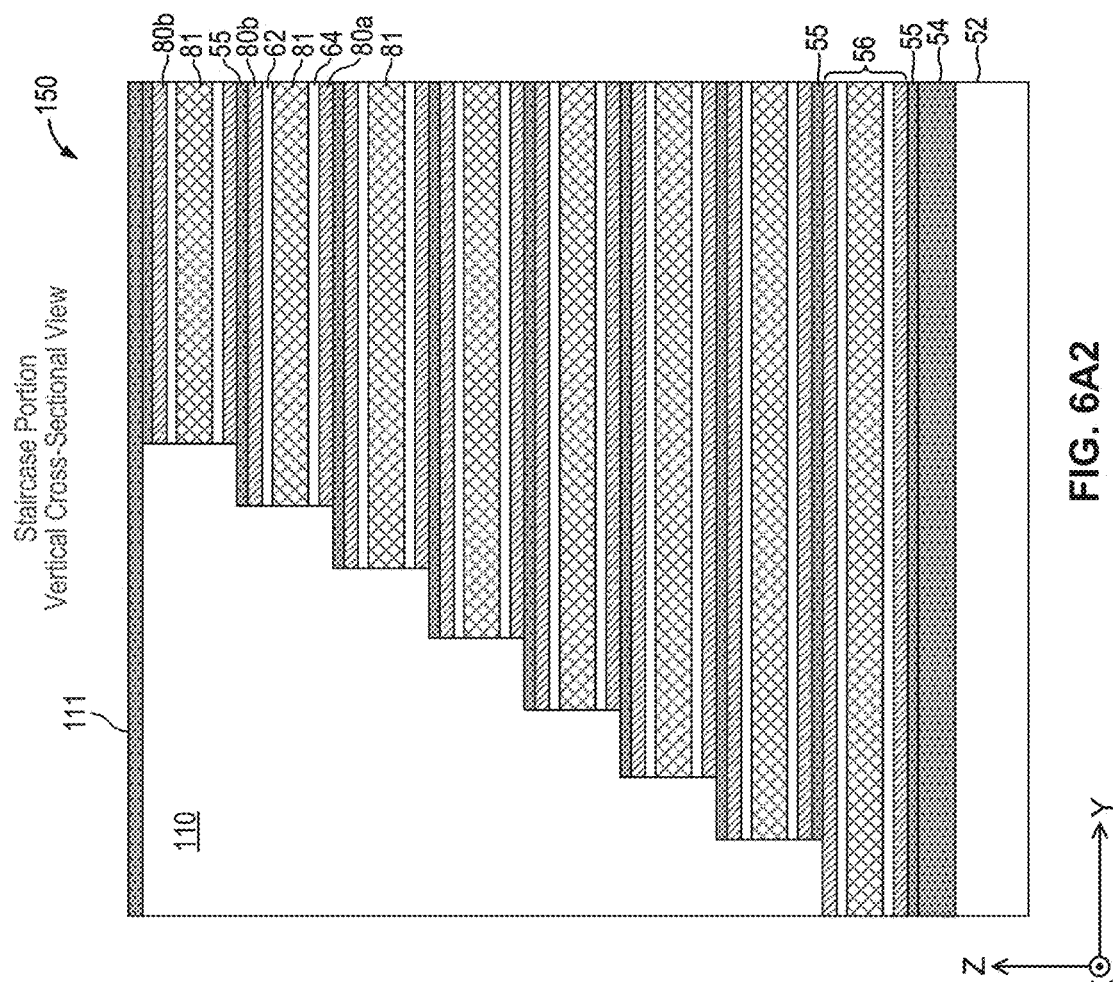
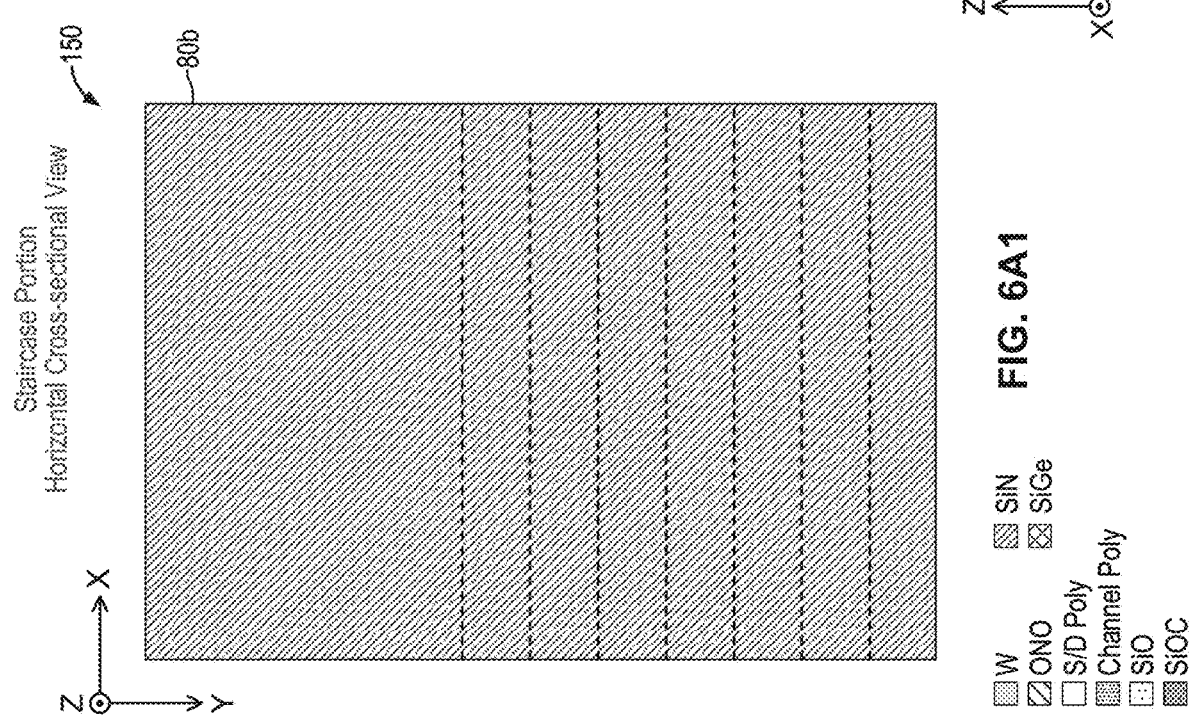
FIG. 6A2
FIG. 6A1

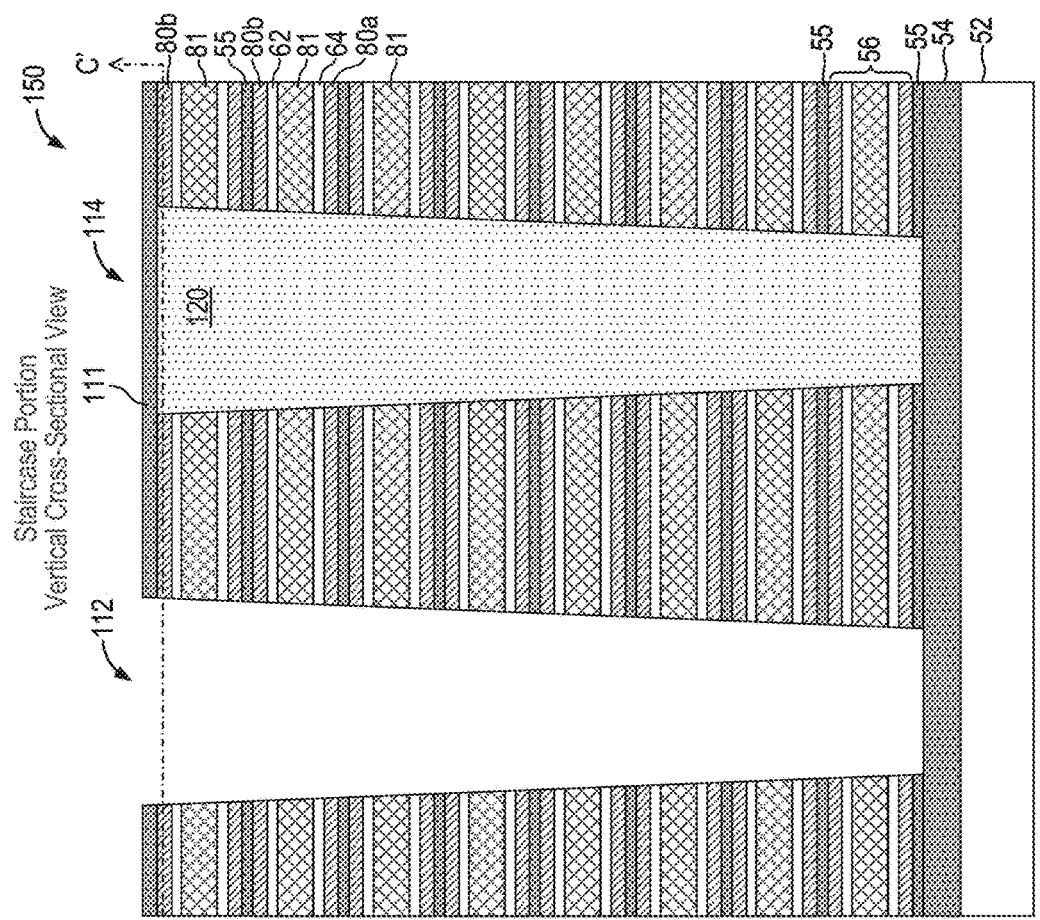
FIG. 6B2
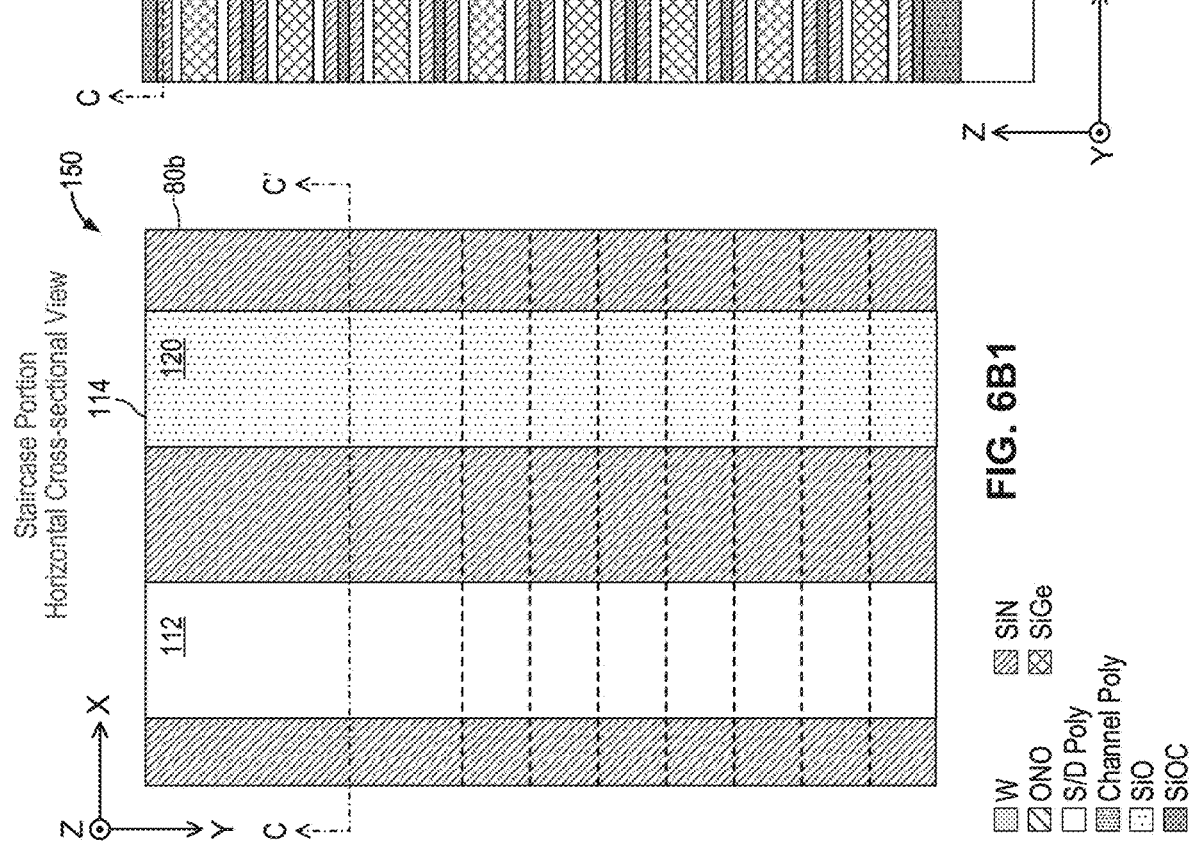
FIG. 6B1

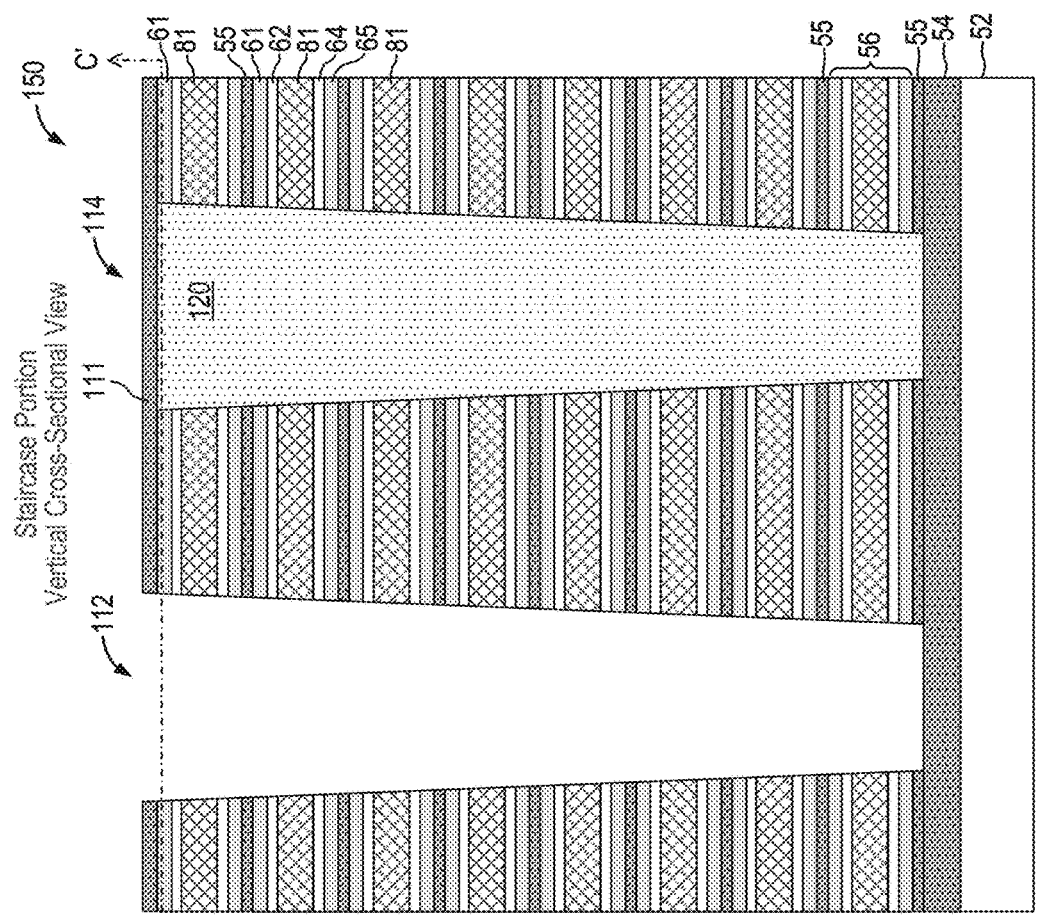
FIG. 6C2
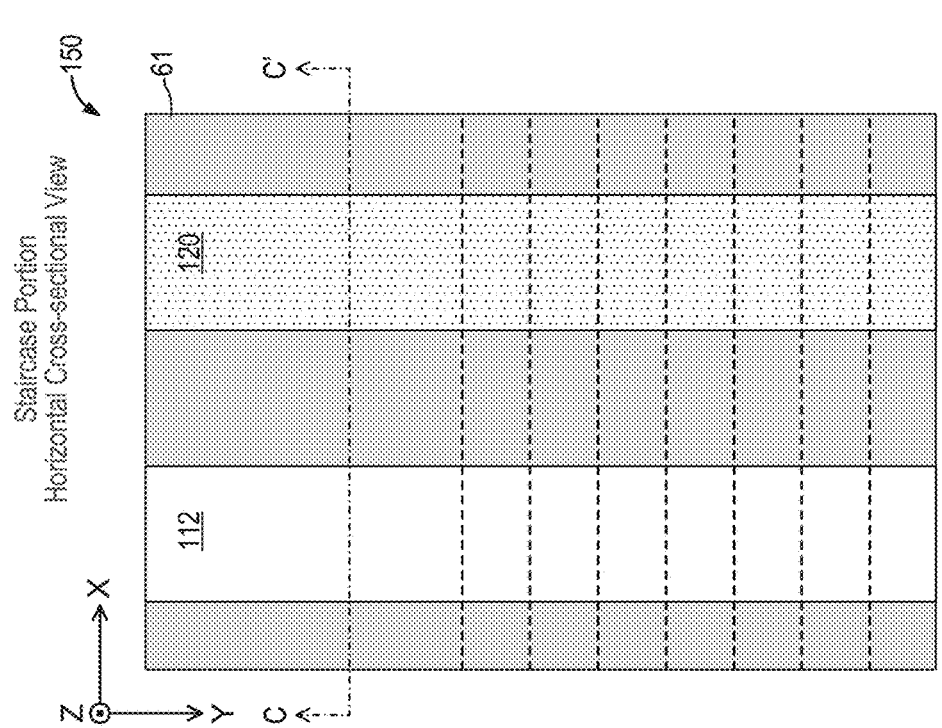
FIG. 6C1

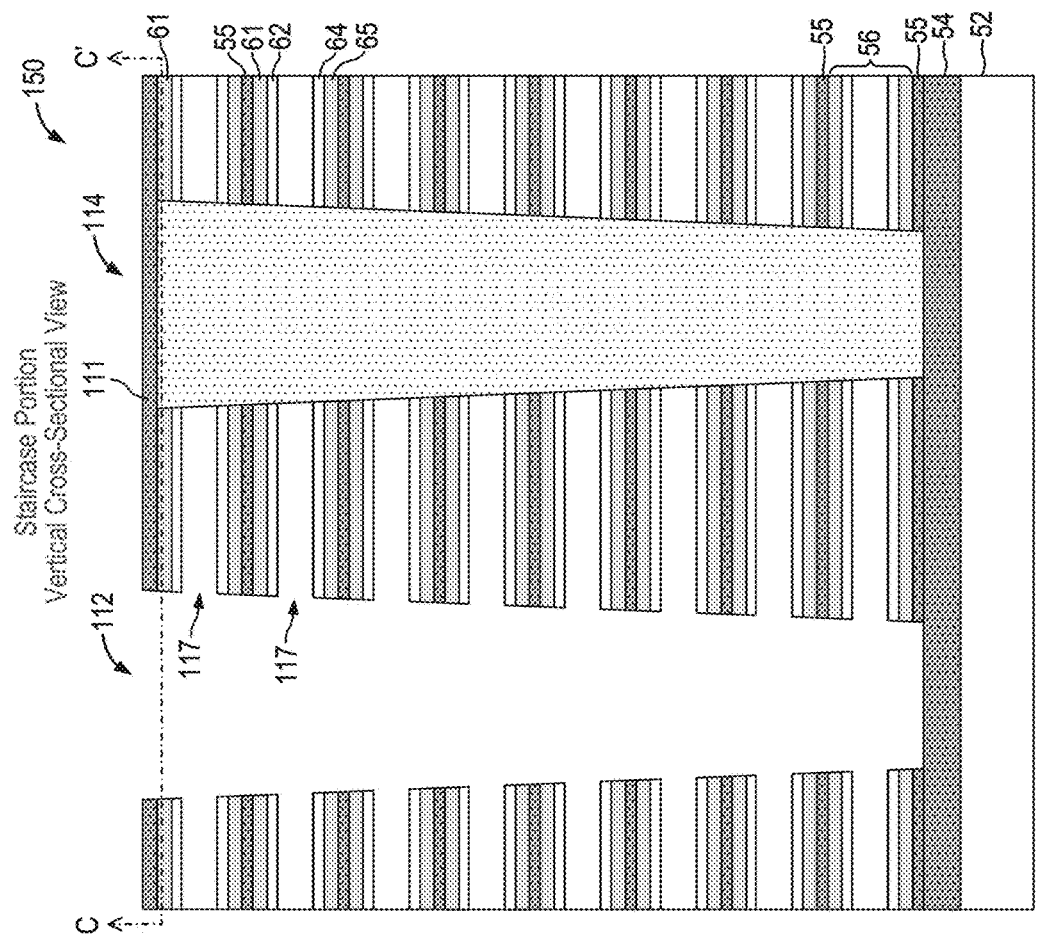
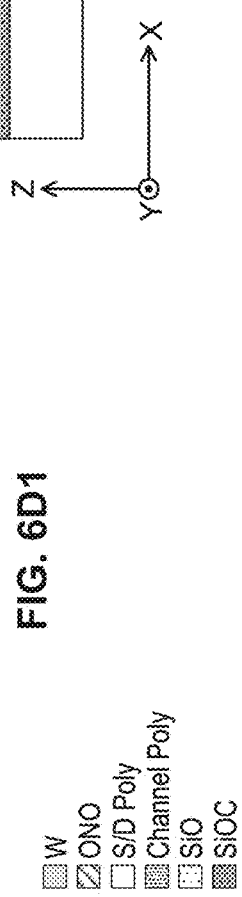
FIG. 6D2
FIG. 6D1

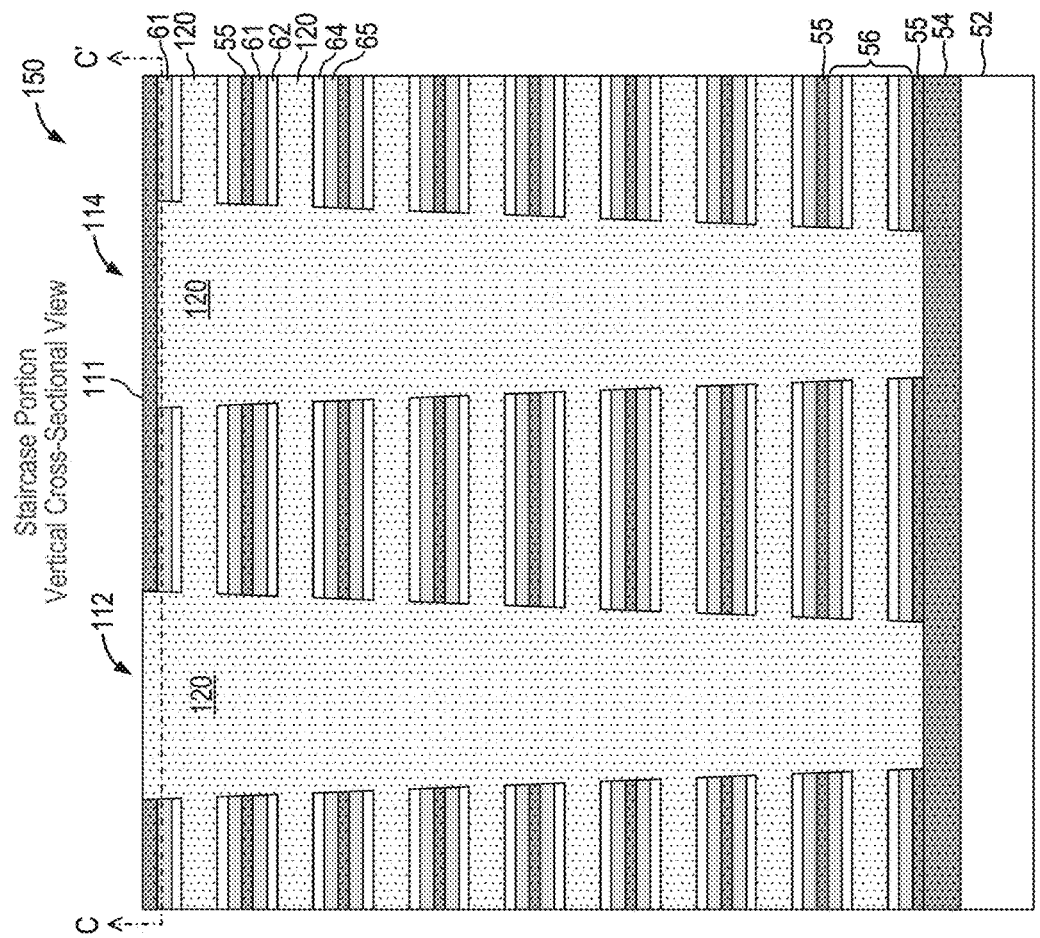
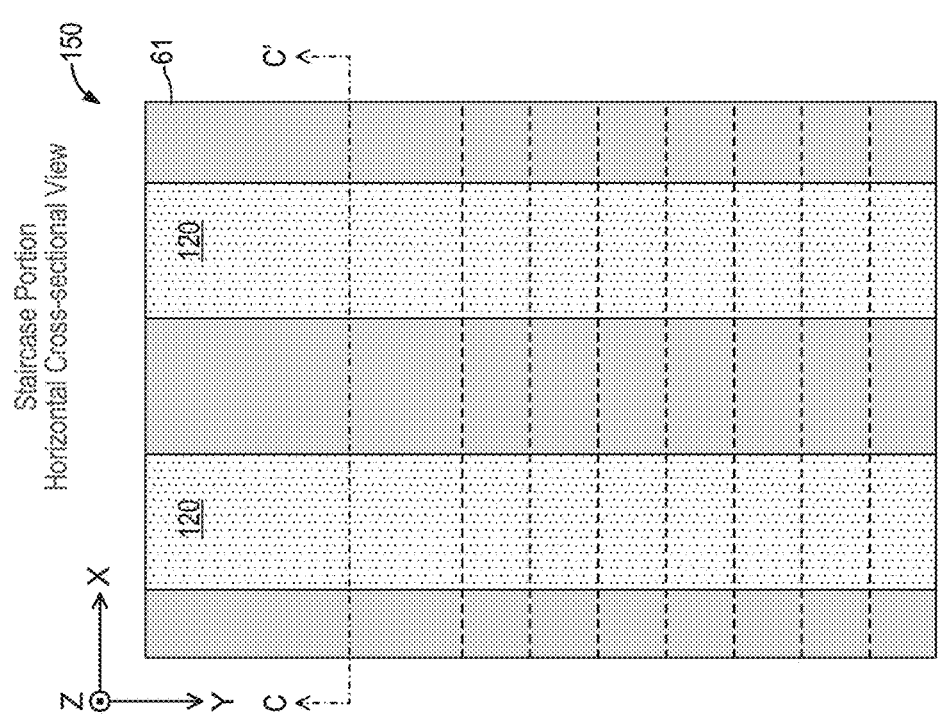
FIG. 6E2
FIG. 6E1

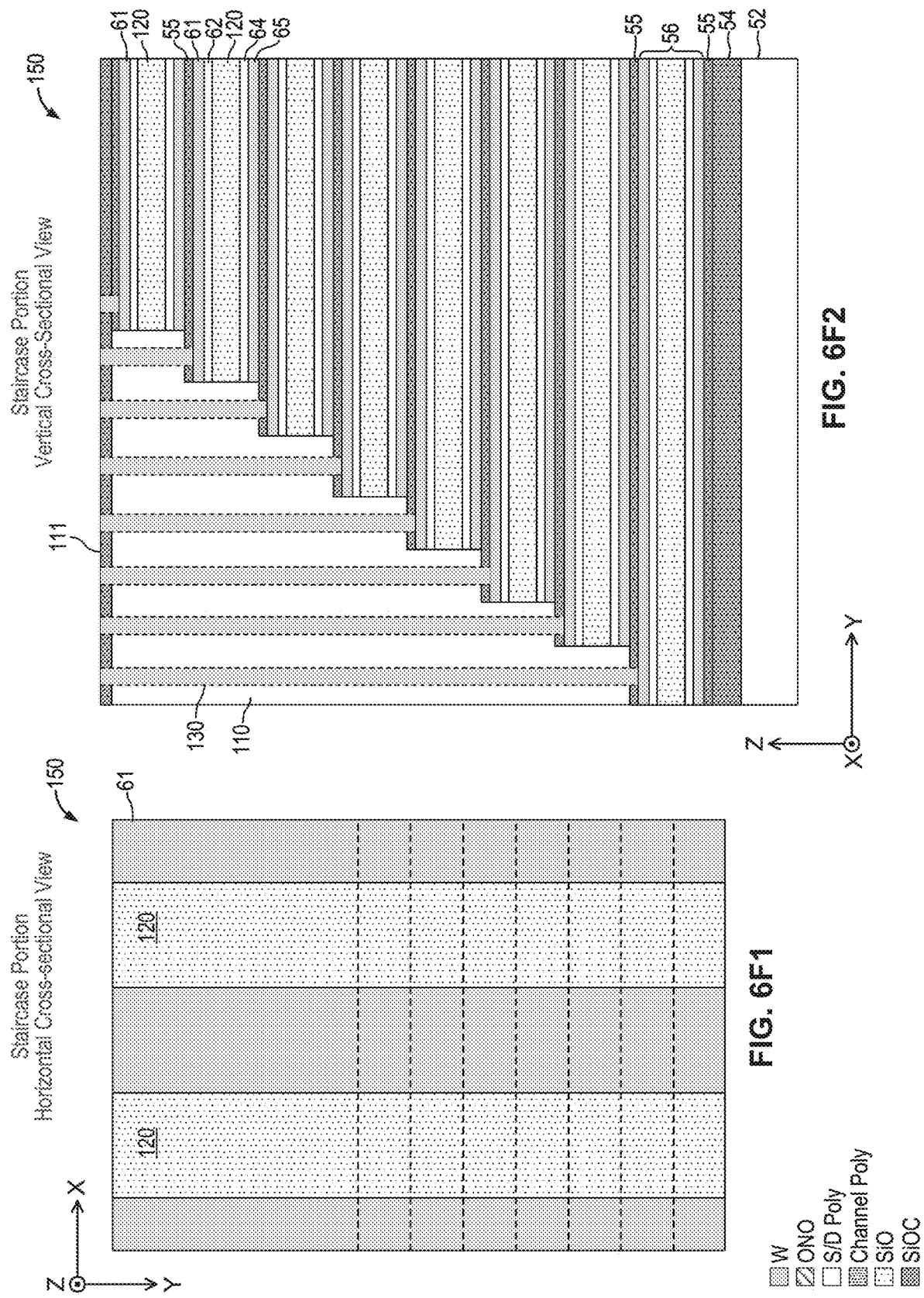
FIG. 6F1
FIG. 6F2

THREE-DIMENSIONAL MEMORY STRUCTURE FABRICATION USING CHANNEL REPLACEMENT

CROSS REFERENCE TO RELATED APPLICATIONS

The present application claims priority to U.S. Provisional Patent Application No. 63/179,019 ("Provisional Application I"), entitled "Three-Dimensional Memory Structure Fabrication Using Channel Replacement," filed on Apr. 23, 2021, which is incorporated herein by reference for all purposes.

The present application is also related to U.S. patent application ("Patent Application I"), Ser. No. 17/382,064, entitled "Methods For Fabricating A 3-Dimensional Memory Structure Of NOR Memory Strings," filed on Jul. 21, 2021; U.S. provisional ("Patent Application II"), Ser. No. 17/382,126, entitled "Methods for Fabricating A 3-Dimensional Memory Structure of NOR Memory Strings," filed on Jul. 21, 2021; and U.S. patent application ("Patent Application III"), Ser. No. 16/894,596, entitled "Capacitive-Coupled Non-Volatile Thin-Film Transistor Strings in Three Dimensional Arrays," filed on Jun. 5, 2020. The disclosures of the Patent Applications I, II, and III are hereby incorporated by reference in their entireties.

FIELD OF THE INVENTION

The present invention relates to manufacturing processes for integrated circuits. In particular, the present invention relates to fabrication processes for thin-film storage transistors organized as NOR memory string arrays.

BACKGROUND OF THE INVENTION

Thin-film storage transistors organized as 3-dimensional arrays of NOR memory strings are disclosed, for example, in U.S. Pat. No. 10,121,553 (the '553 Patent), entitled "Capacitive-Coupled Non-Volatile Thin-film Transistor NOR Strings in Three-Dimensional Arrays," issued on Nov. 6, 2018. The '553 Patent is hereby incorporated by reference in its entirety for all purposes. Briefly, in one implementation of a 3-dimensional array of NOR memory strings, the 3-dimensional array is formed out of thin films that are successively deposited over a planar surface of semiconductor substrate. The thin films may include a number (e.g., 2, 4, 8, 16 . . . ) of groups of thin films (hereinafter, each group of thin films being referred to as an "active layer"), each active layer being provided one on top of another and being separated from the other by an isolation dielectric layer (e.g., silicon oxycarbide (SiOC)). Each active layer is a multilayer that includes a predetermined combination of various semiconductor, conductive and dielectric materials. For example, in the '533 Patent, each active layer includes first and second doped semiconductor layers (e.g., n+ polysilicon) separated by a dielectric layer (e.g., silicon oxide). The active layer may also include one or more conductive layers (e.g., titanium nitride (TiN)-lined tungsten (W)), or sacrificial layers (e.g., silicon nitride) to be subsequently replaced by final conductive layers. In that arrangement, the conductive layers each contact one of the semiconductor layers to provide a signal path of reduced resistivity in the adjacent semiconductor layer it contacts.

After their depositions, the thin films are then cut by the manufacturing process (e.g., by one or more etching steps) to provide narrow trenches that extend lengthwise along a direction substantially parallel to the planar surface (hereinafter, a direction that is parallel to the planar surface is referred to as a "horizontal" direction). These trenches have a depth that extends "vertically" (i.e., along a direction normal to the planar surface) through all or almost all of the thin films, thereby dividing each active layer into narrow strips ("active strips") stacked one on top of another. These stacks of active strips ("active stacks") are separated from each other by the trenches along a direction orthogonal to both the vertical direction and the lengthwise direction of the active strips.

Subsequent processing steps form the NOR memory strings from the active strips. Specifically, as provided in the '533 Patent, the subsequent processing steps form channel regions (e.g., p− polysilicon), charge-storage layers (e.g., oxide-nitride-oxide (ONO) multilayers) and gate electrodes (e.g., TiN-lined W). In the '533 Patent, each gate electrode extends lengthwise in the vertical direction over the depth of the trench. The semiconductor layers of each active strip provide a source region ("common source line") and a drain region ("common bit line") to the storage transistors along one or both sides of the active strip. A storage transistor is formed by the common source line, the common bit line, a channel region in contact with both the common source line and the common bit line, a gate electrode and the portion of a charge-storage layer that is situated between the gate electrode and the channel region. The gate electrodes are also referred to herein as "local word lines." Along each active strip, the storage transistors that share the common source line and the common bit line form a NOR memory string (referred herein as a "Horizontal NOR memory string" or "HNOR memory string").

The '533 Patent also discloses forming, prior to depositions of the thin-films, various types of circuits in or at the surface of the semiconductor substrate to support the operations of the HNOR memory strings to be formed. Such circuits, referred to as "circuits under array" ("CuAs") may include various voltage sources for power supply, ground, programming, erase or read voltages, sense amplifiers, various latches and registers, various logic circuits, and various analog circuits. One or more interconnection conductive layers may provide conductors above, below, or both above and below, the 3-dimensional arrays of HNOR memory strings to connect the common bit line, the common source line and the local word lines to the CuAs. The '533 Patent teaches that, in one implementation, the parasitic capacitance of the common source line is electrically connected to the CuA only briefly for pre-charging to a predetermined voltage. At other times, the common source line is electrically isolated to the CuAs and its pre-charged parasitic capacitance serves as a virtual voltage source (e.g., a virtual ground) during memory operations.

The need to prevent undesirable thermal diffusion of the dopants in the doped semiconductor layers (e.g., n+ polysilicon) into the adjacent channel regions (e.g., p− polysilicon) poses a challenge, as the semiconductor layers are both opposite-doped and of much higher dopant density than the channel regions. To prevent this undesirable thermal diffusion, in addition to a strict thermal budget, arsenic or another dopant of relatively low diffusivity is used in the doped semiconductor layers. Using arsenic, rather than, for example, phosphorus, requires substantially more complex handling procedures.

BRIEF SUMMARY OF THE INVENTION

The present invention uses silicon germanium as a sacrificial material in fabricating thin-film storage transistors, such as those organized as NOR memory strings.

According to one embodiment of the present invention, a process suitable for use in fabricating a memory structure including storage transistors of a NOR memory string above a planar surface of a semiconductor substrate includes: above the planar surface, repeatedly depositing, alternately and one over another, a multilayer and an isolation dielectric layer, each multilayer comprising first and second semiconductor layers, each of a first conductivity type, and a silicon germanium layer between the first and the second semiconductor layers; and forming a plurality of trenches into the multilayers and the isolation dielectric layers, thereby (1) exposing the silicon germanium layers, the first and second semiconductor layers and the isolation dielectric layers at the sidewalls of the trenches, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; and (2) dividing the multilayers into a plurality of stacks of multilayer strips, each stack being separated from an adjacent stack by the width of one of the trenches, with each multilayer strip being the portion of a multilayer between adjacent trenches. The process further includes: filling the trenches with a dielectric filler material; forming multiple via openings in the dielectric filler material of each trench; depositing into each via opening a semiconductor liner layer followed by a silicon germanium sacrificial material; replacing the remainder of the dielectric filler material in the trenches by a charge-storage layer and a conductor; removing the silicon germanium sacrificial material followed by removing the semiconductor liner layer from the plurality of via openings; and through the via openings, in place of each silicon germanium layer of each multilayer, providing a third semiconductor layer of a second conductivity type.

These and other advantages, aspects and novel features of the present disclosure, as well as details of an illustrated embodiment thereof, will be more fully understood from the following description and drawings.

BRIEF DESCRIPTION OF THE DRAWINGS

Various embodiments of the invention are disclosed in the following detailed description and the accompanying drawings. Although the drawings depict various examples of the invention, the invention is not limited by the depicted examples. It is to be understood that, in the drawings, like reference numerals designate like structural elements. Also, it is understood that the depictions in the FIGS. are not necessarily to scale.

FIGS. 4A1, 4A2, 4B1, 4B2, 4C1, 4C2, 4D1, 4D2, 4E1, 4E2, 4F1, 4F2, 4G1, 4G2, 4H1, 4H2, 4I1, 4I2, 4J1, 4J2, 4K1, 4K2, 4L1, and 4L2 illustrate a process for fabricating a memory structure including HNOR memory strings using a channel-last fabrication process with silicon germanium (SiGe) channel replacement according to embodiments of the present disclosure.

FIGS. 5A1, 5A2, 5B1, 5B2, 5C1, 5C2, 5D1, 5D2, 5E1, and 5E2 illustrate a process for forming non-memory storage transistors in an HNOR memory string according to embodiments of the present disclosure.

FIGS. 6A1, 6A2, 6B1, 6B2, 6C1, 6C2, 6D1, 6D2, 6E1, 6E2, 6F1, and 6F2 illustrate a process for forming a staircase structure in the memory structure described above including HNOR memory strings fabricated using the silicon germanium (SiGe) channel replacement process according to embodiments of the present disclosure.

DETAILED DESCRIPTION OF THE INVENTION

According to embodiments of the present disclosure, a process for fabricating a three-dimensional NOR memory string of storage transistors implements a channel-last fabrication process with channel replacement using silicon germanium (SiGe). In particular, the process uses silicon germanium as a sacrificial layer, to be replaced with the channel material after the charge-storage layer of the storage transistors is formed. In this manner, the channel region is prevented from experiencing excessive high-temperature processing steps, such as during the annealing of the charge-storage layer.

The fabrication process of the present disclosure realizes significant advantage for fabricating HNOR memory strings than processes previously disclosed. For instance, the fabrication process is advantageous for reducing dopant out-diffusion from the source-drain semiconductor layers into the channel region which can happen when the channel is formed before a high temperature anneal step, such as the annealing of the charge-storage layer. The fabrication process of the present disclosures forms the channel region after the charge-storage layer is formed, thereby avoiding exposing the channel region to high-temperature anneal process steps.

The fabrication process of the present disclosure with channel replacement also provides other advantages. For example, the storage transistors are formed with charge-storage layers to form the non-volatile or quasi-volatile memory transistors. However, to facilitate the operation of the storage transistors, precharge transistors are provided along each memory string and the precharge transistors are formed as non-memory transistors. That is, the precharge transistors are MOSFET transistors formed with a gate dielectric layer and not a charge-storage layer. The fabrication process of the present disclosure enables precharge transistors to be formed in the NOR memory strings by providing the replacement of the charge-storage layer with a gate dielectric layer at the precharge transistors along the memory strings.

In the present description, to facilitate reference to the figures, a Cartesian coordinate reference frame is used, in which the Z-direction is normal to the planar surface of the semiconductor surface and the X-direction and the Y-directions are orthogonal to the Z-direction and to each other, as indicated in the figures.

Figure 1A:
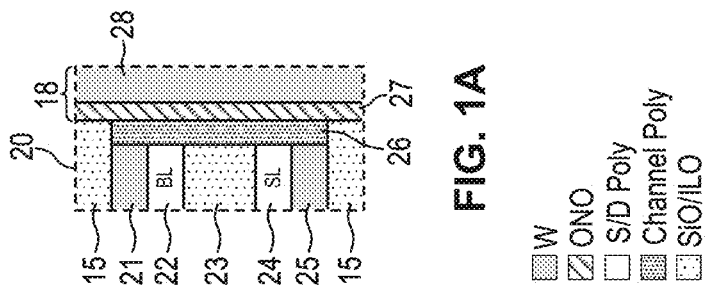
FIG. 1A, is a perspective view of a memory structure including a 3-dimensional array of NOR memory strings in some examples.
Figure 1:
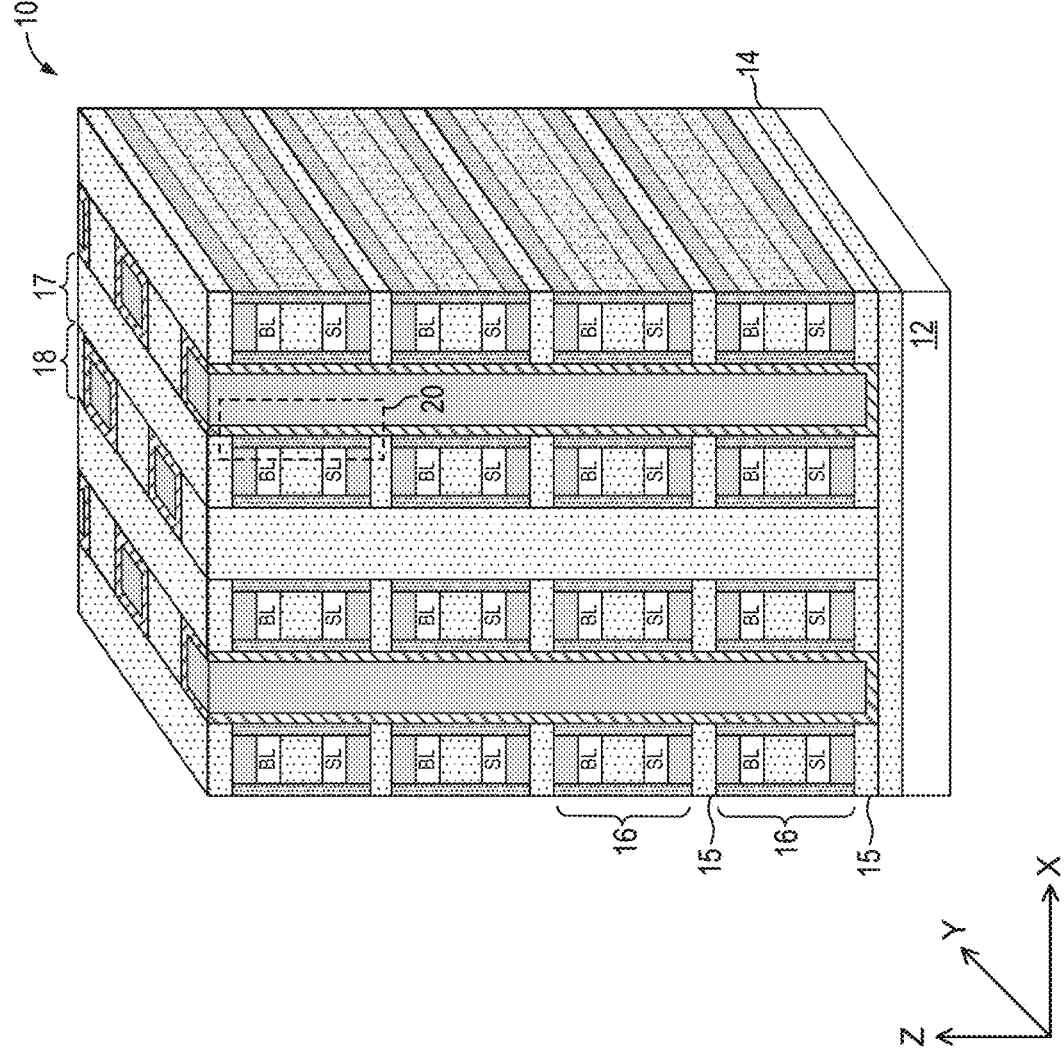
FIG. 1, which includes

FIG. 1, which includes FIG. 1A, is a perspective view of a memory structure including a 3-dimensional array of NOR memory strings in some examples. The memory structure can be used to implemented part of a semiconductor memory device in some examples. Referring to FIG. 1, a memory structure 10 includes a number of active layers 16 formed on a planar surface of a semiconductor substrate 12. An insulation layer 14, such as a buffer oxide layer, may be provided between the semiconductor substrate 12 and the active layers 16 formed on the substrate. The active layers 16 are formed one on top of another in the Z-direction (i.e., along a direction normal to the planar surface of the substrate 12) and separated from each other by an isolation dielectric layer 15, such as a silicon oxycarbide (SiOC) layer. The active layers 16 are divided in the X-direction into narrow strips ("active strips") 17 that are stacked one on top of another to form stacks of active strips ("active stacks") extending in the Y-direction.

Each active layer 16 includes first and second doped semiconductor layers (e.g., n+ polysilicon or heavily doped n-type polysilicon) separated by a dielectric layer (e.g., silicon oxide). Each active layer 16 may include one or more conductive layers (e.g., titanium nitride (TiN)-lined tungsten (W)). Each conductive layer is formed adjacent one of the doped semiconductor layers to reduce the resistivity of the doped semiconductor layer it contacts. During intermediate processing steps, the active layer may include sacrificial layers (e.g., silicon nitride) to be subsequently replaced by the intended conductive layers. Subsequent processing steps form the channel regions (e.g., p− polysilicon or lightly doped p-type polysilicon), the charge-storage layers (e.g., oxide-nitride-oxide (ONO) multilayers) and the gate conductor (e.g., TiN-lined W) in narrow trenches between the separated active stacks. The gate conductors and the charge-storage layers are formed as columnar structures extending in the Z-direction. In the present example, a charge-storage layer encircles a gate conductor in the columnar structure. In the present description, the gate conductors are also referred to as "local word lines" and a gate conductor encircled by a charge-storage layer is collectively referred to a local word line (LWL) structure 18. The first and second doped semiconductor layers of each active strip form a source region ("common source line") and a drain region ("common bit line"), respectively, of the storage transistors which may be formed along one or both sides of the active strip 17. In particular, a storage transistor 20 is formed at the intersection of an active strip 17 with the channel region and an LWL structure 18. In the present illustration, the LWL structures 18 are formed staggered in adjacent trenches bordering an active strip so that storage transistors formed on both sides of an active strip are offset from each other in the Y-direction along the memory string.

FIG. 1A illustrates the detail construction of a storage transistor 20 formed in the memory structure 10. Referring to FIG. 1A, the storage transistor 20 is formed by the first doped semiconductor layer 24 forming the source region (the common source line), the second doped semiconductor layer 22 forming the drain region (the common bit line), the channel region 26 in contact with both the source region 24 and the drain region 22, the gate conductor 28 and the portion of the charge-storage layer 27 that is situated between the gate conductor 28 and the channel region 26. A conductive layer 21 contacts the second doped semiconductor layer 22 forming the common bit line and a conductive layer 25 contacts the first doped semiconductor layer 24 forming the common source line. Each storage transistor 20 is isolated from adjacent storage transistors along an active stack (in the Z-direction) by the isolation dielectric layer 15. As thus configured, along each active strip (in the Y-direction), the storage transistors that share the common source line and the common bit line form a NOR memory string (referred herein as a "Horizontal NOR memory string" or "HNOR memory string").

To complete the memory circuit, various types of circuits are formed in or at the surface of the semiconductor substrate 12 to support the operations of the HNOR memory strings. Such circuits are referred to as "circuits under array" ("CuAs") and may include various voltage sources for power supply, ground, programming, erase or read voltages, sense amplifiers, various latches and registers, various logic circuits, and various analog circuits, as described above.

The memory structure 10 of FIG. 1 illustrates a construction of a 3-dimensional array of NOR memory strings in some examples. In some cases, processes to fabricate the 3-dimensional array of NOR memory strings are developed to enhance the storage transistor characteristics or to improve the manufacturability of the NOR memory strings. In embodiments of the present disclosure, a process to fabricate storage transistors in a NOR memory string implements a channel-last process with silicon germanium (SiGe) channel replacement to realize a simplified fabrication process and to form NOR memory strings with improved electrical characteristics.

Figure 3:
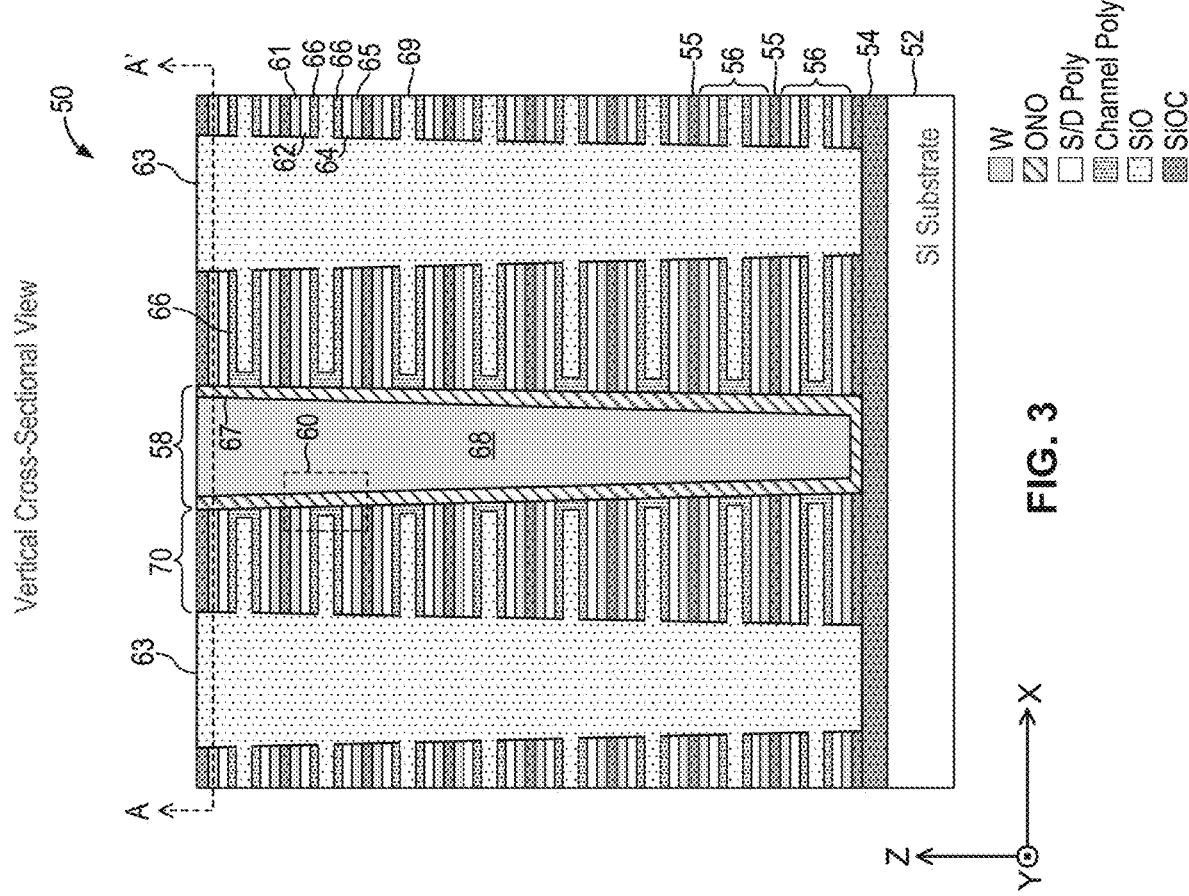
FIG. 3 is a vertical cross-sectional views of the HNOR memory string of FIG. 2 fabricated using a channel-last fabrication process with SiGe channel replacement in embodiments of the present disclosure.
Figure 2:
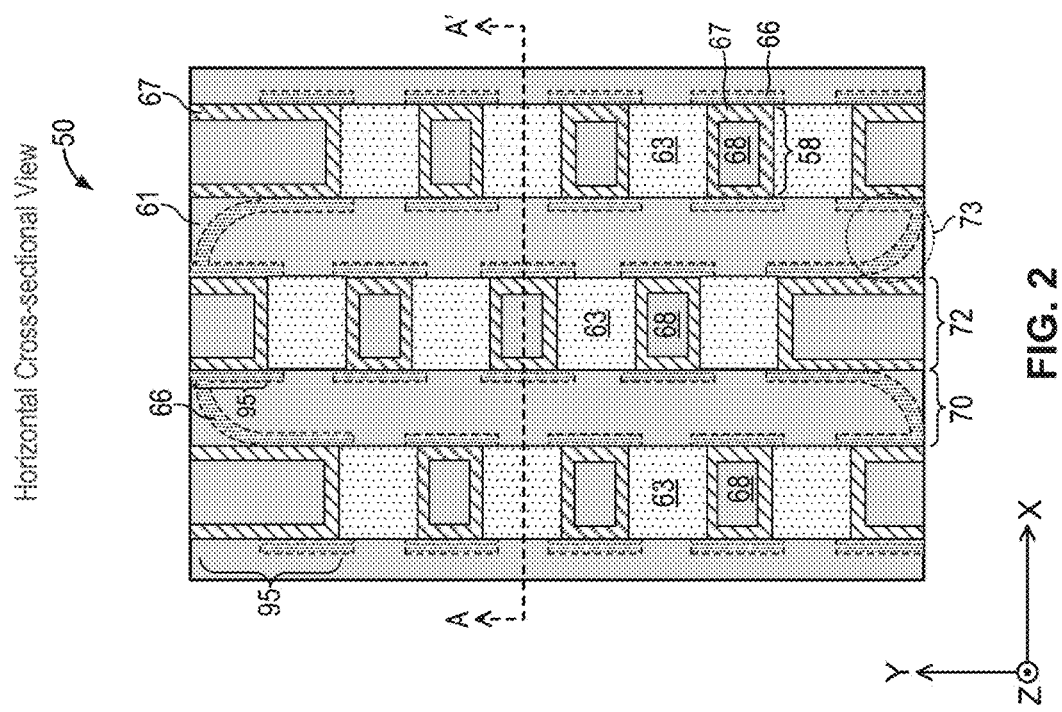
FIG. 2 is a horizontal cross-sectional view of an HNOR memory string fabricated using a channel-last fabrication process with SiGe channel replacement in embodiments of the present disclosure.

FIGS. 2 and 3 are respective horizontal and vertical cross-sectional views of an HNOR memory string fabricated using a channel-last fabrication process with SiGe channel replacement in embodiments of the present disclosure. In particular, the horizontal cross-sectional view of FIG. 2 represents the view taken along the line A-A' in FIG. 3 and the vertical cross-sectional view of FIG. 3 represents the view taken along line A-A' in FIG. 2. Referring to FIGS. 2 and 3, a memory structure 50 is formed using a number of active layers 56 formed on a planar surface of a semiconductor substrate 52. An insulation layer 54, such as a buffer oxide layer, may be provided between the semiconductor substrate 52 and the active layers 56 formed on the substrate. The active layers 56 are formed one on top of another in the Z-direction (i.e. along a direction normal to the planar surface of the substrate 52) and separated from each other by an isolation dielectric layer 55. In some embodiments, the semiconductor substrate 52 is a silicon substrate, the insulation layer 54 is a silicon oxycarbide (SiOC) layer and the isolation dielectric layer 55 is also a silicon oxycarbide (SiOC) layer. The active layers 56 are divided in the X-direction into narrow strips ("active strips") that are stacked one on top of another in the Z-direction to form stacks of active strips ("active stacks") that extend in the Y-direction. In the present description, the reference numeral 70 is used herein to refer to either an active strip or an active stack formed by stacking of multiple active strips. The narrow trenches between each pair of active stacks 70 will be used to form local word line (LWL) structures and are referred herein as LWL region 72.

Each active layer 56 includes first and second doped semiconductor layers 62, 64 separated by a dielectric layer 69. Each active layer 56 further includes first and second conductive layers 61, 65, each conductive layer being adjacent to respective first or second doped semiconductor layer 62 or 64. In some embodiments, the first and second doped semiconductor layers 62, 64 are each an n+ polysilicon layer, the dielectric layer 69 is silicon oxide, and the first and second conductive layers 61, 65 are each a titanium nitride (TiN)-lined tungsten (W) layer. During intermediate processing steps, the active layer may include sacrificial layers (e.g., silicon nitride or silicon germanium) to be subsequently replaced by intended layers.

The memory structure 50 includes dielectric-filled trenches 63 in the LWL regions 72 between adjacent active stacks 70. Local word line (LWL) structures 58, each including a charge storage layer 67 encircling a gate electrode 68, are formed interspersed in the LWL regions 72 and separated by the dielectric-filled trenches 63. In the present embodiment, the LWL structures 58 are formed staggered in adjacent LWL regions 72 between an active stack 70 so that storage transistors formed on both sides of an active strip are offset from each other in the Y-direction. In some embodiments, each charge-storage layer 67 is formed as an oxide-nitride-oxide (ONO) multilayer structure and each gate electrode is formed as titanium nitride (TiN)-lined tungsten (W).

In embodiments of the present disclosure, a channel replacement process is used to form channel regions 66 in each active layer 56. As thus fabricated, in each active layer 56, the channel region 66 is formed lining the inner area between the first and second doped semiconductor layers 62, 64 and the charge-storage layer 67. In the horizontal cross-sectional view of FIG. 2, the channel regions 66 are shown with dotted lines to denote that the channel regions 66 are formed under the conductive layer 61. In some embodiments, the channel regions 66 are formed as a p– poly silicon layer.

Furthermore, as a result of the channel replacement process of the present disclosure, the channel regions 66 are separated and isolated for each storage transistor in the memory structure 50. In particular, in memory structure 50, each channel region 66 is formed adjacent one LWL structure 58 only. The channel region 66 does not extend in the Y-direction to connect to the channel regions of other storage transistors along the same NOR memory string. This is in contrast with other fabrication methods for the NOR memory strings where the channel region is formed as a contiguous layer extending in the Y-direction along the entire HNOR memory string, so that the channel region connects to all storage transistors formed on the same side of an active strip 70. The channel replacement process of the present disclosure forms the channel region after the charge-storage layer 67 is formed so that no recess is required for the doped semiconductor layers 62, 64 and the conductive layers 61, 65 in each active layer to form the channel region. Instead, the channel region 66 is formed in the region between the doped semiconductor layers 62 and 64 and the channel region 66 is separated and isolated from other channel regions of the other storage transistors formed on the same side of the same active strip 70. That is, the channel region 66 is separated and isolated for each storage transistor in the Y-direction. In particular, the channel region 66 for one storage transistor formed adjacent a LWL structure 58 is separated from the channel region 66 formed adjacent other local word line structures 58 in the same active strip. Another result of the channel replacement process of the present disclosure is that the channel region material terminates within each active strip, as shown by the dotted circle 73 in FIG. 2. Accordingly, no additional process steps are required to remove excess channel region materials that may connect channel regions formed on opposite sides of the active strip.

As thus fabricated, a storage transistor 60 is formed at the intersection of an active strip 70 with the channel region 66, the charge-storage layer 67 and the gate electrode 68. The first and second doped semiconductor layers 62, 64 of each active strip 70 form a source region ("common source line") and a drain region ("common bit line") of the storage transistors which may be formed along one or both sides of the active strip 70. In particular, a storage transistor 60 is formed by the first doped semiconductor layer 64 forming the common source line, the second doped semiconductor layer 62 forming the common bit line, the channel region 66 formed between and in contact with both the common source line 64 and the common bit line 62, the gate electrode 68 and the charge-storage layer 66 that is situated between the gate electrode 68 and the channel region 66. The conductive layer 61 contacts the second doped semiconductor layer 62 forming the common bit line and the conductive layer 65 contacts the first doped semiconductor layer 64 forming the common source line. Each storage transistor 60 is isolated from adjacent storage transistors along an active stack (in the Z-direction) by the isolation dielectric layer 55. As thus configured, along each active strip (in the Y-direction), the storage transistors that share the common source line and the common bit line form a NOR memory string or a HNOR memory string.

FIGS. 4A1, 4A2, 4B1, 4B2, 4C1, 4C2, 4D1, 4D2, 4E1, 4E2, 4F1, 4F2, 4G1, 4G2, 4H1, 4H2, 4I1, 4I2, 4J1, 4J2, 4K1, 4K2, 4L1, and 4L2 illustrate a process for fabricating a memory structure including HNOR memory strings using a channel-last fabrication process with silicon germanium (SiGe) channel replacement according to embodiments of the present disclosure. Each figure in FIGS. 4A and 4L includes two views: view 1 is a horizontal cross-sectional view (i.e., in an X-Y plane) along line A-A' in view 2, and view 2 is a vertical cross-sectional view (i.e., in an X-Z plane) along line A-A' in view 1.

Referring to FIG. 4A, initially, a memory structure 50 is formed by successive depositions of (i) a multilayer 56 and (ii) an isolation dielectric layer 55 on the planar surface of a semiconductor substrate 52. In some embodiments, an insulation layer 54 may be provided on the surface of the semiconductor substrate 52 before the active layers 56 are formed on the substrate 52. In some embodiments, the insulation layer 54 may be a buffer oxide layer or a silicon oxycarbide (SiOC) layer. The multilayer 56 includes (a) first silicon nitride layer 80$a$, (b) first n-type-doped amorphous silicon layer 64 (such as phosphorus doped), (c) silicon germanium layer 81, (d) second n-type-doped amorphous silicon layer 62 (such as phosphorus doped), and (e) second silicon nitride layer 80$b$. The isolation dielectric layer 55 may be, for example, a 30-nm thick SiOC layer. First and second silicon nitride layers 80$a$ and 80$b$ each may be 30 nm thick, and first and second phosphorus-doped amorphous silicon layers 62 and 64 each may be 40 nm thick and the silicon germanium layer 81 may be, for example, 120 nm thick. The n-type doped amorphous silicon layers 62, 64 are later annealed to form n+ polysilicon layers and to activate the n-type dopants. The silicon germanium layer 81 may be deposited, for example, using a low pressure chemical vapor deposition process at 400° C., at 2 Torr. In the present description, the dimensions are provided merely for illustrative purposes and are not intended to be limiting. In actual implementation, any suitable thicknesses or dimensions may be used. FIG. 4A shows the memory structure 50 after the depositions of the initial layers of thin films. Multilayer 56 is also referred in this detailed description as an "active layer." View 1 in FIG. 4A illustrates the horizontal cross-section along the silicon nitride layer 80$b$ which is a sacrificial layer to be replaced by a conductive layer in subsequent processing.

Referring to FIG. 4B, a first set of trenches 82 are formed in memory structure 50 using, for example, an anisotropic etch after a photo-lithographical patterning step. In some examples, the trenches 82 may be 70 nm wide, with a spacing of 190 nm apart. Trenches 82 are then filled by a dielectric material 83. In some embodiments, the dielectric material 83 is a silicon oxide material, such as $SiO_2$. Excess dielectric material may be removed from the top of memory structure 50 using, for example, chemical-mechanical polishing (CMP). The resulting memory structure 50 is shown in FIG. 4B.

Referring to FIG. 4C, with the mechanical support from dielectric material 83, a second set of trenches 84 are then cut using substantially the same technique as discussed in conjunction with FIG. 4B above. In some examples, the trenches 84 may be 70 nm wide. Each of the second set of trenches 84 is cut between an adjacent pair of the first set of trenches 82 and each of the second set of trenches 84 is cut substantially equidistant between an adjacent pair of the first set of trenches 82. As a result of trenches 82 and 84 being cut in the multilayer structure, stacks in the multilayer 56 are formed which are referred to as "active stacks" in the present description. In some examples, the active stacks are each approximately 60 nm wide. The resulting narrow strips resulting from the cutting of the active layers 56 are referred herein as "active strips."

Thereafter, first and second silicon nitride layers 80*a* and 80*b* are then removed using, for example, a wet etch, thereby creating cavities between the isolation dielectric layer 55 and respective amorphous silicon layers 62, 64. The cavities are filled by conductive layers 61 and 65. In some example, conductive layers 61 and 65 are each formed by successively depositing a titanium nitride (TiN) liner and a tungsten (W) layer. The TiN liner may be formed using, for example, an atomic layer deposition (ALD) technique. An etching step removes any of the deposited material from the sidewalls of trenches 84. In some examples, an isotropic wet etch is used to remove the deposited material from the sidewalls of trenches 84. Trenches 84 are then filled by the dielectric material 83, such as $SiO_2$. Excess deposited materials may be removed from the top of memory structure 50 by CMP. The resulting memory structure 50 is shown in FIG. 4C.

First and second phosphorus-doped amorphous silicon layers 64 and 62 provide the common source line and the common bit line of an HNOR memory string to be formed. Conductive layers 65 and 61 reduce the resistivity of the adjacent common source line or common bit line they contact.

Referring to FIG. 4D, thereafter, vias 86 are patterned and the dielectric material 83 exposed by the vias 86 in trenches 82 and 84 are etched using, for example, an anisotropic etch. Vias 86 may be oval in the horizontal cross-sectional view 1. In some examples, vias 86 may have a major axis of 100 nm along the X-direction and a minor axis of 60 nm along the Y-direction. Vias 86 are filled at a later time by a dielectric material so as to isolate adjacent storage transistors that are to be formed in an HNOR memory string.

Referring to FIG. 4E, vias 86 are then filled with a sacrificial amorphous silicon liner 90 and a sacrificial silicon germanium layer 91. Excess materials on top of memory structure 50 may be removed using, for example, CMP. With the vias 86 filled, the remainder of dielectric material 83 in trenches 82 and 84 is then removed using, for example, a wet etch step, as illustrated in FIG. 4F. As a result, cavities 93 are formed in trenches 82 and 84 outside of the vias 86 which are now filled with sacrificial layers of amorphous silicon 90 and silicon germanium 91.

Referring to FIG. 4G, charge-storage layer 67 is then conformally deposited on the exposed sidewalls of cavities 93. In some embodiments, the charge-storage layer 67 is a multi-layer that includes, for example, (i) a 1-nm thick tunneling dielectric layer (e.g., silicon oxide ($SiO_2$)); (ii) a 6-nm thick charge-trapping multilayer that includes zirconium oxide (ZrO), silicon nitride (SiN) and $SiO_2$; and (iii) a 3-nm thick blocking layer (e.g., $Al_2O_3$). The charge-storage layer 67 is sometimes referred to as an "OZNOA" layer. After deposition, the multi-layer structure is annealed to form the charge-storage layer 67. For example, the annealing process for the charge-storage layer can be performed at 850° C. for 1 minute. As mentioned above, the dimensions provided herein are merely for illustrative purposes only and are not intended to be limiting. In actual implementations, any suitable thicknesses or dimensions may be used. As known to those of ordinary skill in the art, each of these materials need not be the stoichiometric compounds. For example, the silicon nitride in the charge-trapping layer may be silicon-rich silicon nitride.

After the deposited charge-storage layer 67 is annealed, cavities 93, lined with the charge-storage layer 67, are filled by a conductive layer 68, which may include successively deposited titanium nitride (TiN) liner and tungsten (W) layer. The TiN liner may be formed using, for example, an atomic layer deposition (ALD) technique. In each of cavities 93, between adjacent vias 86 (now filled by sacrificial materials 90, 91), the conductive layer 68 provides a vertical local word line (LWL) that serves as gate electrode for each of the storage transistors that are vertically aligned in the same active stack. The structure resulting from the combination of the charge-storage layer 67 and the conductive layer 68 is referred herein as the local word line (LWL) structure 58. Excess deposited materials may be removed from the top of memory structure 50 by CMP. FIG. 4G illustrates the resulting memory structure 50.

It is instructive to note that the memory structure 50 includes regular sized cavities 93*a* in a central portion of the memory structure and extended sized cavities 93*b* at the edges of the memory structure (FIG. 4F). As a result, the memory structure 50 includes LWL structures 58 formed in the regular sized cavities 93*a* which are to be used to form the storage transistors of the memory strings. The structures 95 formed in the extended sized cavities 93*b* at the edges of the memory structure 50 can be dummy structures or they can be converted to non-memory transistors, where applicable. The exact configuration of the memory structure 50 at the edges of the memory strings is not critical to the practice of the present disclosure.

Referring to FIG. 4H, subsequent to the LWL structures 58 being formed, the sacrificial materials formed in the vias 86 are now removed. First, the silicon germanium layer 91 is removed, such as by using a wet etch step. In this step, the silicon germanium layer 81 formed in the multilayer 56 are protected by the amorphous silicon liner 90 and is not etched. After the silicon germanium layer 91 is removed, the amorphous silicon liner 90 is also removed, such as by using a wet etch step. The resulting memory structure 50 now includes cavities or shafts 96 which exposes the silicon germanium layer 81, as shown in FIG. 4H.

Referring to FIG. 4I, the sacrificial silicon germanium layer 81 is removed through shafts 96, such as by using a wet etch step. The removal of the sacrificial silicon germanium layer 81 leaves cavities 97 in the multilayer 56 between the first and second amorphous silicon layers 62 and 64. In embodiments of the present disclosure, the channel regions for the storage transistors in a HNOR memory string is provided by depositing a p– polysilicon liner in the cavities 97 created by removal of the silicon germanium layer 81.

FIGS. 4J and 4K illustrate the formation of the channel regions subsequent to removal of the sacrificial silicon germanium, in embodiments of the present disclosure. Referring to FIG. 4J, a p– polysilicon layer 66 is deposited into shafts 96 and cavities 97 in the multilayer 56. The p– polysilicon layer 66 is conformally deposited to cover all exposed surfaces of shafts 96 and cavities 97. The p– polysilicon layer 66 is sometimes referred to as a p– polysilicon liner layer. In some example, the deposited p– polysilicon layer 66 is 10 nm thick. With the p– polysilicon layer 66 formed in the cavities 97, the polysilicon layer 66 terminates within the active strips of the memory structure 50 (as shown by the dotted circle 73). No additional processing steps are required to remove the p– polysilicon layer materials at the edge of the memory structure 50.

Referring to FIG. 4K, following the deposition of the p– polysilicon layer 66, an etch-back step is performed to remove the excess polysilicon from the sidewalls of shafts 96, leaving the p– polysilicon layer 66 in the cavities 97. For example, an anisotropic etch can be used to remove the polysilicon on the shaft sidewalls. Along the X-direction, the p– polysilicon layer 66 contacts the charge storage layer 67 of the LWL structure 58. A storage transistor is formed by the common source line (i.e., second phosphorus-doped amorphous silicon layer 64), the common bit line (i.e., first phosphorus-doped amorphous silicon layer 62), a channel region (i.e., p– polysilicon liner layer 66), the portion of charge storage layer 67 in contact with the channel region, and the gate electrode 68 enclosed by that charge storage layer 67.

Referring to FIG. 4L, a dielectric material 63 then fills the shafts 96 and the remaining areas of cavities 97. In some embodiments, the dielectric material 63 is silicon oxide, such as SiO$_2$. Excess material on top of memory structure 50 may be removed by CMP. The resulting memory structure 50 includes multiple layers of HNOR memory strings formed in multiple active stacks to realize a memory device with large capacity.

In FIGS. 4J, 4K and 4L, the p– polysilicon layer 66 is shown with a dotted outline to indicate that the polysilicon layer is formed in the active layer between the amorphous silicon layers 62 and 64 and the polysilicon layer forming the channel region adjacent each LWL structure 58 is formed under the conductive layer 61 in view 1 of the figures.

In some embodiments of the present disclosure, the process for fabricating the memory structure including HNOR memory strings further includes fabrication process steps for forming precharge transistors in the HNOR memory strings. In particular, to facilitate the operation of the storage transistors, precharge transistors are provided along each HNOR memory string where the precharge transistors are used to bias the common source line or the common bit line of a HNOR memory string to a desired voltage. To that end, the precharge transistors are formed as non-memory transistors. That is, the precharge transistors should be formed with a gate dielectric layer instead of the charge-storage layer used by the storage transistors. The fabrication process of the present disclosure enables precharge transistors to be formed in the HNOR memory strings by providing the replacement of the charge-storage layer with a gate dielectric layer at the precharge transistors along the memory strings.

FIGS. 5A1, 5A2, 5B1, 5B2, 5C1, 5C2, 5D1, 5D2, 5E1, and 5E2 illustrate a process for forming non-memory storage transistors in an HNOR memory string according to embodiments of the present disclosure. Each figure in FIGS. 5A to 5E includes two views: view 1 is a horizontal cross-sectional view (i.e., in an X-Y plane) along line A-A' in view 2, and view 2 is a vertical cross-sectional view (i.e., in an X-Z plane) along line A-A' in view 1. In the horizontal cross-sectional view 1 of FIGS. 5A to 5E, the channel regions 66 are shown with dotted lines to denote that the channel regions 66 are formed under the conductive layer 61.

FIG. 5A illustrates the memory structure 50 after the processing steps described above for forming the storage transistors in multiple layers of HNOR memory strings. The HNOR memory strings are formed extending in the Y-direction. At given locations along the memory strings, structures 98 for forming precharge transistors are provided. Each of the structures 98 for forming precharge transistors has extended dimensions in the Y-direction to form precharge transistors with extended channel width. That is, the precharge transistors have channel width much larger than the channel width of the storage transistors 60. At the end of the process to form the HNOR memory strings, the structures 98 are formed to include the charge-storage layer 67 and the conductive layer 68, the same as the LWL structure 58 of the storage transistors.

To form the precharge transistors in structures 98, a mask 100 is applied to the memory structure 50 to cover all of the memory string with an opening 101 exposing at least a part of the structures 98, as shown in FIG. 5B. In some embodiments, the mask 100 is a silicon mask. Referring to FIG. 5C, using the mask 100, the gate electrode conductive material 68 and the charge-storage layer 67 formed in the structures 98 are removed, such as by one or more wet etch steps. Cavities 102 are then formed in the structures 98. Referring to FIG. 5D, the mask 100 is then removed, exposing the entire cavities 102 for forming the precharge transistors.

Referring to FIG. 5E, a gate dielectric layer 104 is then deposited on the sidewalls of the cavities 102. In one embodiment, the gate dielectric layer 104 is a gate oxide or silicon oxide layer. Then, the remaining areas of the cavities 102, lined with the gate dielectric layer 104, are filled by a conductive layer 106, which may include successively deposited titanium nitride (TiN) liner and tungsten (W) layer. The TiN liner and the tungsten layer may be formed using methods described above. In each structure 98, the conductive layer 106 forms the gate electrode of the precharge transistor. Excess deposited materials may be removed from the top of memory structure 50 by CMP. FIG. 5E illustrates the resulting precharge transistors thus formed.

The memory structure 50 of the present disclosure includes a memory array portion fabricated as described above to form the 3-dimensional array of NOR memory strings. To complete the memory device, the memory structure includes staircase portions provided at the ends of the memory strings (in the Y-directions). The thin-film storage transistors of the NOR memory strings are formed in the memory array portion while the staircase portions include staircase structures to provide connections through conductive vias to the common bit lines and, optionally, the common source lines also, of the NOR memory strings. In some embodiments, the common source lines are precharged through the pre-charge transistors to serve as virtual voltage reference source during program, read and erase operations, thereby obviating the need for a continuous electrical connection to the source lines from the support circuitry during such operations. In embodiments of the present disclosure, processing steps for forming staircase structures in the memory structure fabricated using silicon germanium (SiGe) channel replacement is described below in more details. In some embodiments, the processing steps for forming the staircase structures can be before, after, or interleaved with the processing steps for forming the memory array portion described above.

FIGS. 6A1, 6A2, 6B1, 6B2, 6C1, 6C2, 6D1, 6D2, 6E1, 6E2, 6F1, and 6F2 illustrate a process for forming a staircase structure in the memory structure described above including HNOR memory strings fabricated using the silicon germanium (SiGe) channel replacement process according to embodiments of the present disclosure. More specifically, after the memory structure 50 is formed by successive deposition of the multilayer (active layer 56) and the isolation dielectric layer 55, as shown in FIG. 4A, a staircase terrace is formed in the staircase portion of the memory structure before further processing in the memory array portion. Referring to FIG. 6A, in some embodiments, in the staircase portion 150 of the memory structure 50, successive recessing and etching steps are used to create a staircase terrace exposing a portion of each active layer 56. Note that the staircase structure is shown in a Y-Z cross-section plane in FIG. 6A, different from the X-Z cross-section plane used above to illustrate the formation of the storage transistors.

For example, in some embodiments, the surface of the staircase portion 150 of the memory structure 50 is patterned by a mask layer to expose a first portion of the memory structure. The exposed portion of the topmost isolation dielectric layer 55 is then removed to expose a portion of the multilayer (active layer) 56 underneath. The exposed portion of the multilayer 56 is then removed, exposing a portion of the isolation dielectric layer 55 underneath. The mask layer is then recessed to expose a new portion of the isolation dielectric layer 55. Removal of the exposed isolation dielectric layer 55, removal of the multilayer 56 and recessing the mask layer are then repeated 7 more times to form the staircase structure as shown in FIG. 6A. Thereafter, an oxide layer 110 is deposited to fill the portions of active layers removed. For example, the oxide layer 110 may be a silicon oxide layer. A chemical-mechanical polishing (CMP) step is carried out to remove the mask layer and to planarize the top surface of memory structure 50. At a suitable subsequent processing step, conductor-filled vias are created to provide connection to the conductive layers in the active layer 56 in the staircase portion 150. It is instructive to note that at the present processing step, the active layer 56 includes the sacrificial silicon nitride layers 80a, 80b which are to be replaced with conductive layers in subsequent processing steps.

In the present embodiment, subsequent to the staircase terrace formation, a first set of trenches are formed in the staircase structure and the trenches are filled with a dielectric filler material, such as silicon oxide. In particular, the first set of trenches extend in the Y-direction to cut the staircase structure into strips, separated by the trenches, in the X-direction. In one embodiment, the trenches may have a width of approximately 130 nm with a spacing of approximately 390 nm. After forming the first set of trenches in the staircase terrace, a dielectric layer 111, such as a silicon oxycarbide (SiOC) layer, is deposited on at least the oxide layer 110 and the dielectric filled trenches to protect the oxide layer 110 and the dielectric filler material in the first set of trenches from the subsequent memory array portion processing steps. In the present embodiment, subsequent to forming the first set of trenches in the staircase structure, the memory structure 50 proceeds to form the memory array portion, including the storage transistors and the precharge transistors, as described above with reference to FIGS. 4A-4L and FIGS. 5A to 5E.

Subsequent to the memory array portion being formed, the processing of the staircase portion resumes. In FIGS. 6B to 6E, the staircase portion 150 is shown in the X-Z plane to illustrate the remaining processing of the staircase portion. Referring to FIG. 6B, at this processing stage, the staircase structure in the staircase portion 150 includes the first set of trenches 114 previously formed, where the trenches 114 are filled with a dielectric filler material 120, such as silicon oxide. At this processing stage, the staircase structure still includes the sacrificial silicon nitride layers 80a, 80b and the sacrificial silicon germanium layer 81. To complete the staircase structure, a second set of trenches 112 are formed in the staircase portion 150, as shown in FIG. 6B. Each trench of the second set is formed in the staircase structure between a pair of trenches 114 of the first set so that trenches 112 and 114 are both approximately 130 nm in width and the spacing between the trenches are also about 130 nm.

Referring to FIG. 6C, with the trenches 112 thus formed, the sacrificial silicon nitride layers 80a, 80b are removed and replaced with first and second conductive layers 61, 65, respectively. For example, the first and second conductive layers 61, 65 are each a titanium nitride (TiN)-lined tungsten (W) layer. An etching step is carried out to remove the deposited material from the sidewalls of trenches 112. In some examples, an isotropic wet etch is used to remove the deposited material from the sidewalls of trenches 112.

Referring to FIG. 6D, subsequent to the replacement of the sacrificial silicon nitride layers, the sacrificial silicon germanium layer 81 is removed through the trenches 112, such as by using a wet etch step. The removal of the sacrificial silicon germanium layer 81 leaves cavities 117 in the multilayer 56 between the first and second amorphous silicon layers 62 and 64.

Referring to FIG. 6E, the staircase structure is completed by filling the cavities 117 and the trenches 112 with a dielectric filler material 120. Excess deposited materials may be removed from the top of the staircase portion 150 by CMP. As thus formed, the trenches 112 and 114 are filled with the same dielectric filler material 120, such as a silicon oxide.

FIG. 6F illustrates the staircase portion 150 in the Y-Z plane after the processing step of FIG. 6E. As thus formed, the staircase structure includes the exposed conductive layer 61 for each multilayer 56 in a staircase fashion. Subsequent processing steps are performed to form conductor-filled vias to provide connection to the conductive layers 61 in each active layer 56 in the staircase portion 150. In FIG. 6F, the conductive-filled vias are depicted by dotted lines to illustrate the via structure for connecting to each of the active layer 56 using the staircase structure.

In alternate embodiments of the present disclosure, the process for fabricating a three-dimensional NOR memory string of storage transistors can be adapted to form a three-dimensional NOR memory string of ferroelectric memory transistors. In some embodiments, the ferroelectric memory transistors are thin-film ferroelectric field-effect transistors (FeFETs) having a ferroelectric polarization layer as a gate dielectric layer, the ferroelectric polarization layer being formed adjacent an oxide semiconductor layer as a channel region. The ferroelectric memory transistors include source and drain regions—both formed of a metallic conductive material—in electrical contact with the semiconductor oxide channel region. The semiconductor layers for the source-drain regions are omitted and the ferroelectric memory transistors thus formed are each a junctionless transistor without a p/n junction in the channel. As thus formed, the ferroelectric memory transistor has a threshold voltage that is modulated by the polarization of the mobile carriers in the ferroelectric polarization layer. In some embodiments, the ferroelectric polarization layer is formed of a doped hafnium oxide material and the semiconductor oxide channel region is formed of an amorphous metal oxide semiconductor material.

In some embodiments, the channel layer 26 is formed using an amorphous oxide semiconductor material, such as indium gallium zinc oxide (InGaZnO or IGZO), indium zinc oxide (IZO), indium tungsten oxide (IWO), or indium tin oxide (ITO), or other such semiconductor oxide materials. In some embodiments, the ferroelectric polarization layer is formed of a doped hafnium oxide material, such as zirconium-doped hafnium oxide (HfZrO or "HZO"). In other embodiments, the hafnium oxide can be doped with silicon (Si), iridium (Ir) or lanthanum (La). In some embodiments, the ferroelectric polarization layer is a material selected from: zirconium-doped hafnium oxide (HZO), silicon-doped hafnium oxide (HSO), aluminum zirconium-doped hafnium oxide (HfZrAlO), aluminum-doped hafnium oxide (HfO2:Al), lanthanum-doped hafnium oxide (HfO2:La), hafnium zirconium oxynitride (HfZrON), hafnium zirconium aluminum oxide (HfZrAlO), and any hafnium oxide that includes zirconium impurities.

In this detailed description, various embodiments or examples of the present invention may be implemented in numerous ways, including as a process; an apparatus; a system; and a composition of matter. A detailed description of one or more embodiments of the invention is provided above along with accompanying figures that illustrate the principles of the invention. The invention is described in connection with such embodiments, but the invention is not limited to any embodiment. Numerous modifications and variations within the scope of the present invention are possible. The scope of the invention is limited only by the claims and the invention encompasses numerous alternatives, modifications, and equivalents. Numerous specific details are set forth in the description in order to provide a thorough understanding of the invention. These details are provided for the purpose of example and the invention may be practiced according to the claims without some or all of these specific details. For the purpose of clarity, technical material that is known in the technical fields related to the invention has not been described in detail so that the invention is not unnecessarily obscured. The present invention is defined by the appended claims.

The invention claimed is:

1. A process suitable for use in fabricating a memory structure comprising storage transistors of a NOR memory string above a planar surface of a semiconductor substrate, the process comprising:

above the planar surface, repeatedly depositing, alternately and one over another, a multilayer and an isolation dielectric layer, each multilayer comprising first and second semiconductor layers, each of a first conductivity type, and a silicon germanium layer between the first and the second semiconductor layers;

forming a plurality of trenches into the multilayers and the isolation dielectric layers, thereby (1) exposing the silicon germanium layers, the first and second semiconductor layers and the isolation dielectric layers at the sidewalls of the trenches, each trench having (i) a depth that extends along a first direction that is substantially normal to the planar surface, (ii) a length that extends along a second direction that is substantially parallel to the planar surface, (iii) a width that extends along a third direction that is substantially orthogonal to the depth and the length, the length of the trench being substantially greater than its width; and (2) dividing the multilayers into a plurality of stacks of multilayer strips, each stack being separated from an adjacent stack by the width of one of the trenches, with each multilayer strip being the portion of a multilayer between adjacent trenches;

filling the trenches with a dielectric filler material;

forming a plurality of via openings in the dielectric filler material of each trench;

depositing into each via opening a semiconductor liner layer followed by a silicon germanium sacrificial material;

replacing the remainder of the dielectric filler material in the trenches by a charge-storage layer and a conductor;

removing the silicon germanium sacrificial material followed by removing the semiconductor liner layer from the plurality of via openings; and through the via openings, in place of each silicon germanium layer of each multilayer, providing a third semiconductor layer of a second conductivity type.

2. The process of claim 1, wherein through the via openings, in place of each silicon germanium layer of each multilayer, providing the third semiconductor layer of the second conductivity type comprises:

removing the silicon germanium layer in each multilayer, thereby forming cavities between the first and second semiconductor layers in each multilayer;

through the via openings, depositing the third semiconductor layer conformally along the sidewalls of the via openings and in the cavities in the multilayer; and removing the third semiconductor layer along the sidewalls of the via openings.

3. The process of claim 2, wherein the third semiconductor layer comprises a conformal poly silicon liner layer.

4. The process of claim 2, wherein the charge-storage layer and the conductor are formed in excavated cavities in the trenches after removal of the dielectric filler material from the trenches outside of the via openings, the charge-storage layer and the conductor formed in each excavated cavity forming a local word line structure, and wherein removing the third semiconductor layer along the sidewalls of the via openings further comprises:

separating the third semiconductor layer into portions, each portion being adjacent to a local word line structure and being isolated from other portions of the third semiconductor layer.

5. The process of claim 2, wherein the third semiconductor layer terminates within each multilayer strip at edges of the memory structure.

6. The process of claim 1, wherein the charge-storage layer and the conductor are formed in excavated cavities in the trenches after removal of the dielectric filler material from the trenches outside of the via openings, the charge-storage layer and the conductor formed in each excavated cavity forming a local word line structure, wherein the local word line structures in a first trench are positioned staggered from the local word line structures in a second trench adjacent the first trench.

7. The process of claim 1, wherein removing the silicon germanium sacrificial material followed by removing the semiconductor liner layer from the plurality of via openings comprises:

removing, by a wet etch step, the silicon germanium sacrificial material with the silicon germanium layer in the multilayers being prevented from removal by the semiconductor liner layer; and removing the semiconductor liner layer.

8. The process of claim 1, further comprising:

applying a mask to the memory structure, the mask including a first opening to expose a first portion of the memory structure at which non-memory transistors are to be formed;

through the first opening, removing the conductive layer and the charge-storage layer formed in the trenches, thereby forming cavities in the trenches;

removing the mask; and depositing into each cavity a gate dielectric layer and a gate conductor, wherein a non-memory transistor is formed by the third semiconductor layer, the first and second semiconductor layers, the gate dielectric layer and the gate conductor.

9. The process of claim 8, wherein the non-memory transistor has a transistor width in the second direction much greater than a width in the second direction of the charge-storage layer formed in the trenches.

10. The process of claim 1, wherein replacing the remainder of the dielectric filler material in the trenches by a charge-storage layer and a conductor comprises:

removing the remainder of the dielectric filler material from the trenches to create excavated cavities in each trench, the excavated cavities being separated from each other by the semiconductor liner layer and the silicon germanium sacrificial material filling the via openings;

in each excavated cavity in each trench, depositing conformally the charge-storage layer on the sidewalls of the excavated cavity; and filling the excavated cavity by the conductor.

11. The process of claim 1, wherein the charge-storage layer comprises a tunneling dielectric layer, a charge-trapping layer and a blocking layer.

12. The process of claim 1, wherein the charge-storage layer comprises one or more of: silicon oxide, zirconium oxide, one or more multi-layers each comprising silicon oxide and silicon nitride, aluminum oxide, and any combination thereof.

13. The process of claim 1, wherein the conductor comprises titanium nitride-lined tungsten, the isolation dielectric layer comprises silicon oxycarbide, the dielectric filler material comprises silicon oxide, and the semiconductor liner layer comprises a sacrificial amorphous silicon liner.

14. The process of claim 1, wherein each via opening is oval and has a major axis that is greater than the width of the trench, such that forming the via opening also removes a portion of the multiplayers on each side of the trench.

15. The process of claim 1, wherein the trenches are formed in multiple phases wherein, in each phase, a subset of the trenches are cut and filled with the dielectric filler material.

16. The process of claim 1, wherein the first and second semiconductor layers of the first conductivity type each comprises a heavily doped n-type polysilicon layer and the third semiconductor layer of the second conductivity type comprises a lightly doped p-type polysilicon layer.

17. The process of claim 1, wherein the third semiconductor layer that is in place of the silicon germanium layer, the first and second semiconductor layers, the charge-storage layer, and the conductor form a storage transistor of the NOR memory string.

18. The process of claim 1, wherein each multilayer further comprises first and second conductive layers, the first conductive layer being formed next to the first semiconductor layer away from the silicon germanium layer and the second conductive layer being formed next to the second semiconductor layer away from the silicon germanium layer.

19. The process of claim 18, wherein each of the first and second conductive layers comprises a titanium nitride-lined tungsten layer.

20. The process of claim 1, further comprising subsequent to forming the multilayers and the isolation dielectric layers, forming a staircase structure at an end portion of the multilayers and the isolation dielectric layers along the length of the memory structure, wherein forming the staircase structure comprising:

forming a staircase terrace structure in the multilayers and the isolation dielectric layers to expose a portion of each multilayer and filling the staircase terrace with a dielectric filler material;

forming a first set of trenches in the staircase terrace structure;

filling the first set of trenches with the dielectric filler material;

forming a second set of trenches in the staircase terrace structure, each trench in the second set being formed between trenches in the first set;

through the second set of trenches, removing the silicon germanium layer of each multilayer; and filing cavities created by removal of the silicon germanium layer in the multilayer and the second set of trenches with the dielectric filler material.

21. The process of claim 20, wherein forming the staircase terrace structure and forming the first set of trenches are performed prior to forming the plurality of trenches into the multilayer; and forming the second set of trenches in the staircase terrace structure is performed subsequent to the step of providing the third semiconductor layer.

22. The process of claim 20, wherein each multilayer further comprises first and second conductive layers, the first conductive layer being formed next to the first semiconductor layer away from the silicon germanium layer and the second conductive layer being formed next to the second semiconductor layer away from the silicon germanium layer.

23. The process of claim 22, wherein the staircase terrace structure exposes a portion of the first conductive layer of each multilayer.

\* \* \* \* \*